United States Patent [19]

Lopresti et al.

[11] Patent Number: 5,889,506

[45] Date of Patent: Mar. 30, 1999

[54] VIDEO USER'S ENVIRONMENT

[75] Inventors: Daniel P. Lopresti, Hopewell; Yue Ma, Plainsboro, both of N.J.; Andrew Tomkins, Pittsburgh, Pa.; Jian Zhou, Plainsboro, N.J.

[73] Assignee: Matsushita Electric Industrial Co., Ltd., Osaka, Japan

[21] Appl. No.: 736,982

[22] Filed: Oct. 25, 1996

[51] Int. Cl.⁶ .................................................. G09G 5/08
[52] U.S. Cl. .................. 345/158; 340/825.22; 341/176; 345/169; 455/151.4
[58] Field of Search .................................. 345/158, 169, 345/173, 179, 181; 340/825.22; 455/151.1, 151.4; 348/734, 715, 589; 341/176

[56] References Cited

U.S. PATENT DOCUMENTS

| | | | |
|---|---|---|---|
| 3,740,465 | 6/1973 | Dorsey | 348/725 |
| 4,009,330 | 2/1977 | Cutler et al. | 348/22 |
| 4,455,450 | 6/1984 | Margolin | 178/18.03 |
| 4,484,218 | 11/1984 | Boland et al. | 348/7 |
| 4,706,121 | 11/1987 | Young | 348/27 |
| 4,718,112 | 1/1988 | Shinoda | 455/151.4 |
| 4,908,713 | 3/1990 | Levine | 386/83 |
| 4,924,303 | 5/1990 | Brandon et al. | 348/7 |
| 4,963,994 | 10/1990 | Levine | 386/83 |
| 4,977,455 | 12/1990 | Young | 348/460 |
| 4,987,486 | 1/1991 | Johnson et al. | 348/10 |
| 4,991,011 | 2/1991 | Johnson et al. | 348/589 |
| 5,010,500 | 4/1991 | Makkuni et al. | 345/358 |
| 5,077,607 | 12/1991 | Johnson et al. | 348/13 |
| 5,151,789 | 9/1992 | Young | 348/734 |
| 5,184,115 | 2/1993 | Black et al. | 345/173 |
| 5,192,999 | 3/1993 | Graczyk et al. | 348/552 |
| 5,237,327 | 8/1993 | Saitoh et al. | 341/176 |
| 5,247,347 | 9/1993 | Litteral et al. | 348/7 |
| 5,339,095 | 8/1994 | Redford | 345/158 |
| 5,343,239 | 8/1994 | Lappington et al. | 348/12 |
| 5,353,121 | 10/1994 | Young et al. | 348/563 |
| 5,355,480 | 10/1994 | Smith et al. | 345/348 |
| 5,396,546 | 3/1995 | Remillard | 379/93.24 |
| 5,404,393 | 4/1995 | Remillard | 379/93.25 |
| 5,442,390 | 8/1995 | Hooper et al. | 348/7 |
| 5,442,456 | 8/1995 | Hansen | 386/106 |
| 5,459,489 | 10/1995 | Redford | 345/179 |
| 5,459,522 | 10/1995 | Pint | 348/478 |
| 5,461,667 | 10/1995 | Remillard | 379/93.24 |
| 5,479,266 | 12/1995 | Young et al. | 386/83 |

(List continued on next page.)

OTHER PUBLICATIONS

Technology Update, "Can your TV see into the future?", Carl Kramer, prior to Oct. 25, 1996.

Circle Reader Service No. 211, "Start Watching TV on Your PC . . . ", Hauppauge Computer Works, Inc., prior to Oct. 25, 1996.

Human Factors in Computing Systems, Common Ground CHI 96, CHI 96 Conference Proceedings, "Dual Device User Interface Design: PDAs and Interactive Television", Scott Robertson, Cathleen Wharton, Catherine Ashworth, Marita Franzke, Apr. 13–18, 1996, Vancouver, British Columbia, Canada, pp. 79–86.

*Primary Examiner*—Thomas Mullen
*Assistant Examiner*—John Tweel, Jr.
*Attorney, Agent, or Firm*—Harness, Dickey & Pierce, P.L.C.

[57] ABSTRACT

The user communicates through a digitizing writing surface with the audio/video control apparatus. An on-screen display is generated, providing the user with a user environment in which a wide range of different tasks and functions can be performed. The digitizing writing surface can be incorporated into a hand-held remote control unit and the audio/video control apparatus may likewise be incorporated into existing home entertainment or computer equipment. By tapping on the writing surface a command bar is presented on the screen, allowing the user to select among various functions. Included in these functions is an on-screen programming feature, allowing the user to select programs for viewing or recording by entry of user-drawn annotations or commands via the writing surface.

31 Claims, 20 Drawing Sheets

U.S. PATENT DOCUMENTS

| | | | |
|---|---|---|---|
| 5,479,268 | 12/1995 | Young et al. | 386/83 |
| 5,532,754 | 7/1996 | Young et al. | 348/569 |
| 5,537,104 | 7/1996 | Van Dort et al. | 340/825.22 |
| 5,539,478 | 7/1996 | Bertram et al. | 345/158 |
| 5,539,479 | 7/1996 | Bertram | 345/158 |
| 5,545,857 | 8/1996 | Lee et al. | 345/158 |
| 5,550,576 | 8/1996 | Klosterman | 348/6 |
| 5,598,487 | 1/1997 | Hacker et al. | 345/169 |
| 5,619,274 | 4/1997 | Roop et al. | 348/461 |
| B1 4,706,121 | 12/1993 | Young . | |

VIDEO USER'S ENVIRONMENT

BACKGROUND AND SUMMARY OF THE INVENTION

The present invention relates generally to the control of audio, video and multimedia equipment. More particularly, the invention relates to an on-screen user interface for interacting with audio, video and multimedia components using a remote control apparatus having a digitized writing surface for entry of hand-drawn instructions by the user.

Television is on the verge of a revolution. Previously separate computer, communications and consumer electronics technologies are converging. This convergence will undoubtedly yield a rich assortment of program content and services, although it is by no means clear that a user will be able to navigate through the assortment of choices to find what he or she is interested in. For example, future systems are expected to provide both high quality digital, audio and video, up to 500 channels of programming, and a variety of on-demand services, including home shopping and banking, interactive games and entertainment, multimedia libraries and full access to the Internet.

Providing a user interface for a complex system such as this is by no means a simple task. Easy-to-use access to a complex system—as television is expected to become—simply cannot be accomplished using the numeric keypad and forward and reverse buttons on today's hand-held remote controls. In terms of convenience and usability, present hand-held remote controls have already reached the point of diminishing returns. Adding more buttons makes these systems harder to control, not easier. Some systems today use on-screen display to echo the current operating parameter of a remote control push button as it is being pushed. While pressing the Color Tint button, for example, the conventional system may display a bar graph showing the current tint setting. While this simple user feedback system is certainly better than nothing, it by no means solves the more fundamental problem of how to provide intuitive control to users of all ages and all nationalities. Also, while the on-screen display of parameters may be viewable in a darkened room, the push buttons used to control these parameters may not be visible. Thus the greater the number of push buttons on a hand-held remote, the harder it becomes to locate the correct push button while in a room darkened for optimal viewing.

Aside from the shortcomings of push button user interface technology, current technology is also deficient in supporting users that do not have the time or inclination to learn complex system features or users, such as preschool children, who cannot read. The addition of a computer style keyboard for controlling the functions does not help to simplify such a system. Moreover, the placement of a keyboard on the family room coffee table appears less acceptable than a small remote control or digitized writing tablet.

The present invention takes a fresh approach to the problem. Although the hand-held remote with push buttons may still be used, the present invention provides a digitizing writing surface through which the user may enter hand-drawn instructions. These instructions can be handwritten text, symbols or even pictures, all of which are written to the digitized writing surface using a pen or stylus. Such a means for controlling the system and providing input appeals to a broader range of users than does a conventional keyboard. Through the mechanism of providing hand-drawn instructions, complex systems can be controlled with ease.

The user can create his or her own hand-drawn instructions (words, symbols, pictures, etc.) to represent any desired control function, even complex control functions such as instructing the audio/video system to turn on at a certain time and display the user's selected favorite program, or to search all available programs to locate those meeting the user's criteria of interest. This hand-drawn input can also include gestures which are recognized by the system and processed as commands to control various functions of the audio/video system. For example, drawing a large "X" over the digitized writing surface could be interpreted as a command to turn off the television and/or the audio/video system. Additionally, handwritten symbols or text input can be written to the digitized writing surface and then processed using known handwriting recognition technology as if the symbols were typed on a keyboard. Once the handwriting is translated into standard character symbol codes, this input can be further processed or stored in the system's memory for later use.

According to one aspect of the invention, the enhanced video user environment comprises an audio/video control apparatus that selectively performs predetermined audio/video control functions according to the user's selection or instruction. The control apparatus is preferably designed with a port for coupling to a video display apparatus, such as a television, or projection system or monitor. The audio/video control apparatus can be packaged separately from the existing audio/video equipment, or it can be incorporated into existing components. A remote control apparatus having a digitizing writing surface is provided for entry of hand-drawn instructions by the user. The remote control apparatus communicates with the audio/video control apparatus. Alternatively, a full-featured personal digital assistant (PDA) that implements TV remote control as one of its programmable functions could also be used as the remote control apparatus. Many commercially available PDAs currently include means for wireless communication, such as an infrared link.

The system further includes a processor that communicates with the audio/video control apparatus, the remote control apparatus or both. The processor controls operation of the video display apparatus in accordance with the hand-drawn instructions provided through the digitizing writing surface. The processor can be incorporated with the circuitry of the audio/video control apparatus, or it can be incorporated with the circuitry of the remote control apparatus. It is also possible to implement the invention using multiple processors, one associated with the audio/video control, and another associated with the remote control. The multiple processors work in concert as distributed processors to implement the processing functions required by the invention.

For a more complete understanding of the invention, its objects and advantages, refer to the following specification and to the accompanying drawings.

BRIEF DESCRIPTION OF THE DRAWINGS

FIG. 20 is a functional diagram illustrating the basic edit distance technique used by the preferred embodiment; and FIG. 21 is another functional diagram illustrating how approximate matching may be performed with the edit distance technique.

DESCRIPTION OF THE PREFERRED EMBODIMENT

The present invention may be implemented as an audio/video system having an enhanced video user interface or video user environment. Many different implementations are possible. Before proceeding with a detailed description of the system in its presently preferred form, an overview of two different implementations will be illustrated and described. These are simply examples of how one might implement the invention in a working system. Other systems are of course possible.

Figure 1:
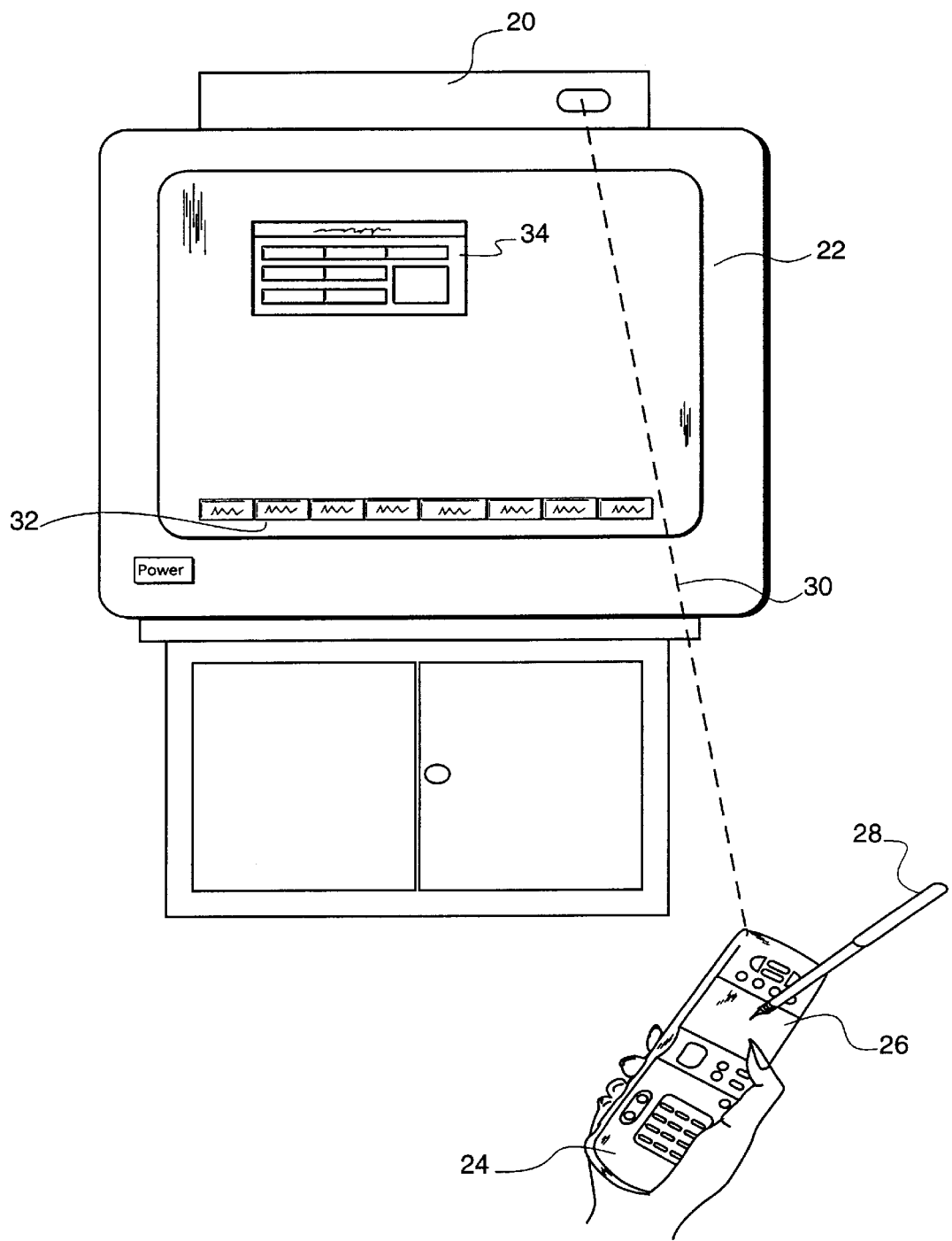
FIG. 1 illustrates a first embodiment of the invention in which the audio/video control apparatus is packaged as a set top box, suitable for use with a simple television set.

Referring to FIG. 1 the system of the invention is illustrated in a simple embodiment suitable for use with standalone television sets or other less complex home entertainment systems. As illustrated in FIG. 1, the invention includes an audio/video control unit 20 that is packaged as a set-top box designed for placement atop a television 22. The handheld remote control 24 includes a digitizing writing surface 26 on which the user may enter hand-drawn instructions using a suitable pen or stylus 28. A personal digital assistant (PDA) could also be substituted or used in conjunction with remote control 24 and would include a digitizing writing surface and stylus. The control unit 20 and remote control 24 communicate with one another via an infrared link depicted diagrammatically at 30. In this embodiment, the audio/video control unit includes a port on the rear of the unit (not shown) for coupling to the Video In port of television 22. In this way, the television 22 serves as a video display apparatus upon which the video user interface is projected. In FIG. 1 the video user interface has been shown in reduced detail as including a command bar 32 and a user interactive panel 34. The command bar 32 and panel 34 are projected onto the television screen (by inclusion of appropriate signals) with the existing NTSC video signals generated by the television tuner. Full details of the video user interface will be presented below. If desired, the control unit 20 may include a television tuner module suitable for receiving and decoding radio frequency television broadcasts via antenna or cable input. The tuner module supplies NTSC video signals to the Video In port of the television, bypassing the need to use the internal tuner section of the television.

Figure 2:
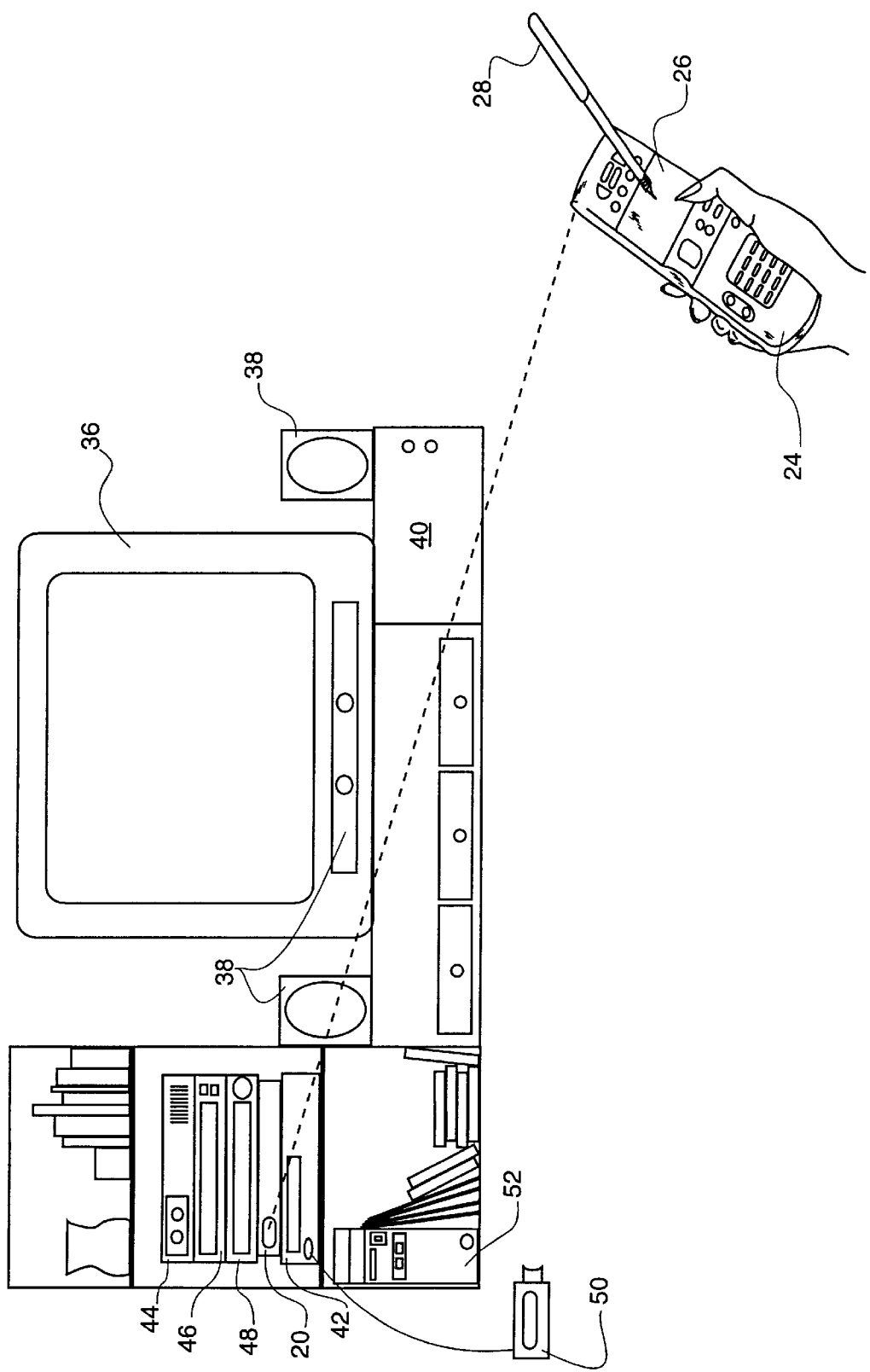
FIG. 2 is another embodiment of the invention in which the audio/video control apparatus is packaged as part of a home entertainment system.

A more complex home entertainment system is shown in FIG. 2. In this embodiment the remote control 24 is essentially the same as described in connection with FIG. 1. The control unit 20 may be configured as a rack mount unit for inclusion in the home entertainment system, along with other components of audio/video equipment. For illustration purposes, the home entertainment system depicted here includes a large screen projection television 36, surround sound speakers 38, subwoofer 40 and multifunction tuner/amplifier 42. The tuner/amplifier has video and audio inputs to which additional components of audio/video equipment may be connected. Illustrated here is a digital audio tape player 44, VCR 46, laser disc player 48 and camcorder 50. These are simply examples of the type of equipment that might be used with the present invention. Also included in the illustrated system is a personal computer 52. The personal computer may be connected to an Internet service provider. The control unit 20 is shown as a separate component in FIG. 2 for illustration purposes. However, it is not necessary to package the control unit 20 as a separate component as illustrated here. Rather, the control unit may be incorporated into any of the audio/video components, including the television itself.

Figure 3:
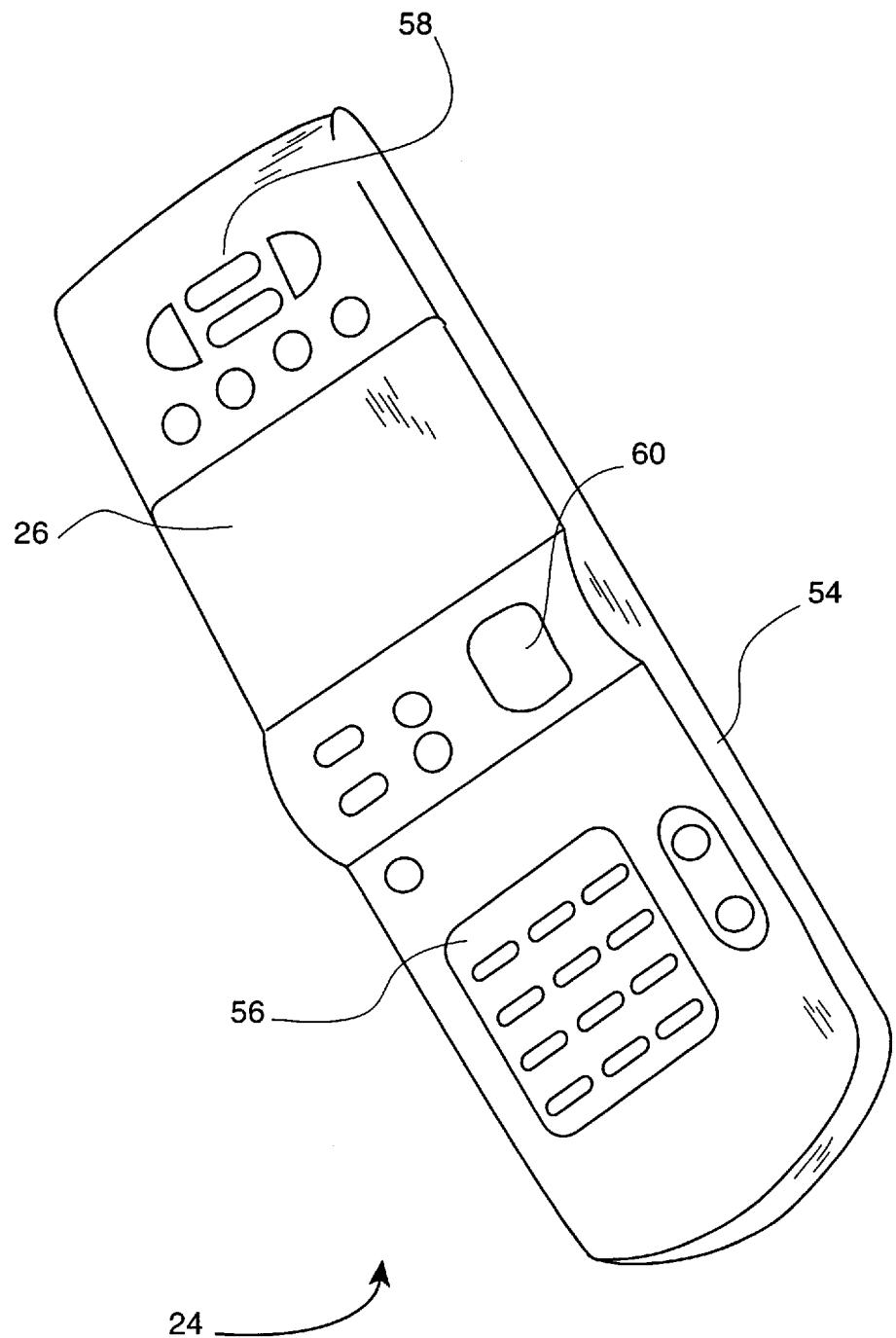
FIG. 3 is a close up perspective view of an exemplary remote control unit with digitizing writing surface.

An enlarged view of the remote control 24 is shown in FIG. 3. The presently preferred remote control 24 is housed in a hand-held case 54 having generally the same form factor and dimensions as a conventional hand-held remote control unit. The remote control includes a conventional numeric keypad 56, VCR and laser disc motion control buttons 58 as well as selected other buttons for providing convenient control of commonly used features. A thumb-operated jog shuttle wheel 60 may also be included for selecting various other system operating functions. Alternatively, a jog shuttle dial may be used in place of the thumb operated jog shuttle.

The remote control 24 includes a digitizing writing surface 26 that is designed to receive hand-drawn input through a pen or stylus 28. If desired, the digitizing writing surface can be hingedly attached to the case 54, allowing the writing surface to be flipped up to reveal additional push buttons beneath. The digitizing writing surface 26 of the preferred embodiment is a passive screen that accepts pen stroke input (according to the ink data type described below) without providing visual feedback on the writing surface itself. According to this embodiment, the visual feedback appears on the video screen. One skilled in the art will also appreciate that digitizing writing surface 26 may be embodied in a separate tablet unit which can be placed upon a fixed surface, such as a table, allowing the tablet to be written to more comfortably. Alternatively, the digitizing writing surface may be implemented as an active screen that not only accepts pen stroke input but also includes a writable display. The active screen may be backlit so that it may be viewed in the dark.

Figure 4:
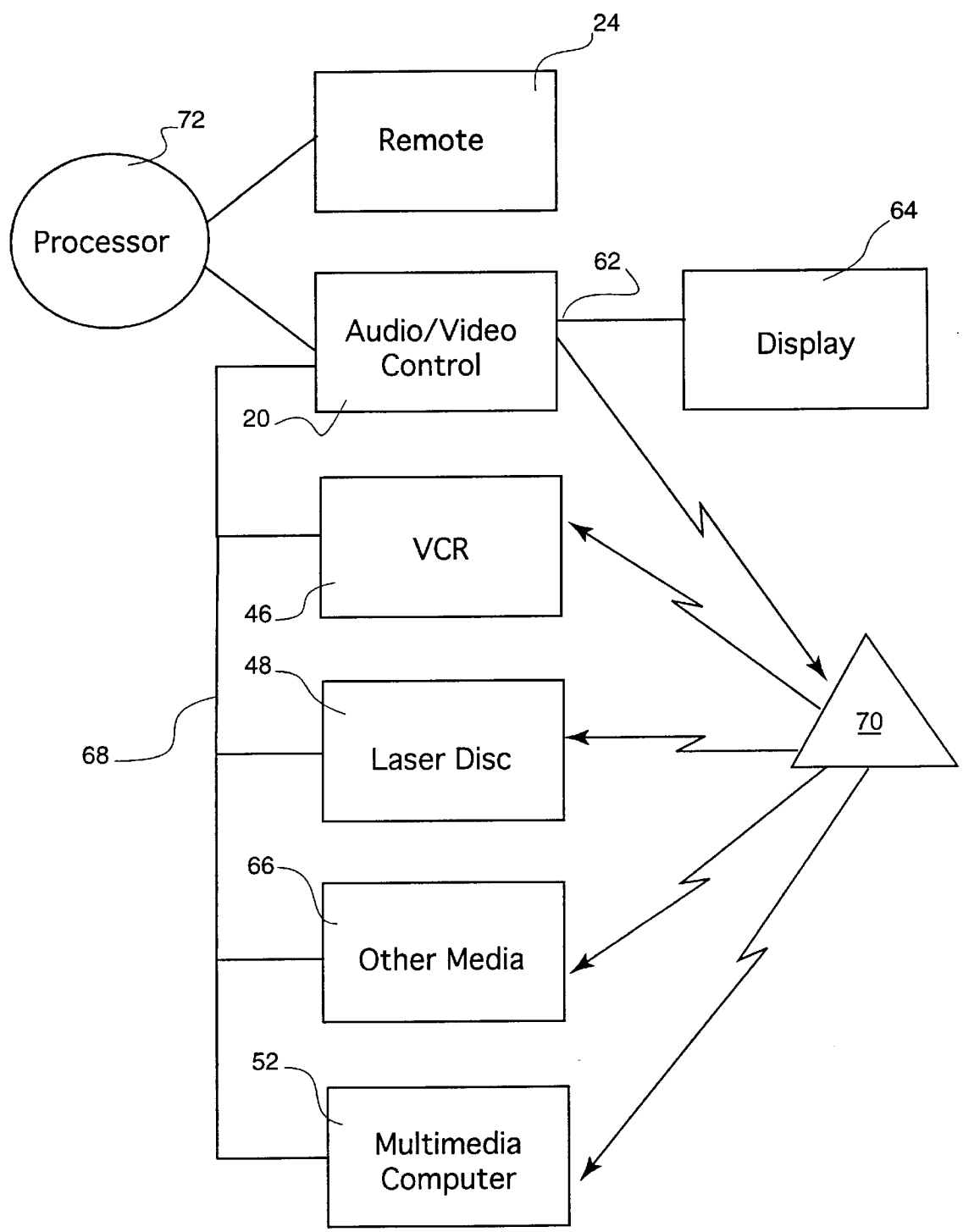
FIG. 4 is a system block diagram showing the components of the invention together with examples of other components of audio/video equipment, illustrating how the invention is interconnected with this equipment.

An overview of the presently preferred system is shown in FIG. 4. Specifically, FIG. 4 illustrates the control unit 20 and remote control 24 previously described. The control unit 20 includes a port 62 for coupling to a video display apparatus 64. As previously discussed, the display apparatus may be a television set or television monitor, or it may be a flat panel display, a projection system or a computer monitor. In most home entertainment systems the display function is provided by the television.

The audio/video control 20 may also be coupled to other equipment such as VCR 46, laser disc player 48 and multimedia computer 52. This is not intended to be an exhaustive list, as there is a wealth of entertainment and information technology that can be coupled to the audio/video control 20. In FIG. 4 this other equipment is shown diagrammatically as other media 66. These media are preferably connected by conventional cabling 68 to the audio/video control 20. The audio/video control thus operates as the audio/video signal switching and processing center for the system. For example, if the user has selected the VCR 46 as the source of program content, the audio and video signals from the VCR are switched through audio/video control 20 and communicated through port 62 to display 64. In this regard, the audio/video control 20 is preferably capable of handling multiple tasks concurrently. Thus the laser disc player 48 may be selected as the current source of program material for presentation on display 64, while VCR 46 is taping a television broadcast for later viewing. The audio/video control may include a television tuner to supply the necessary audio and video signals to the VCR.

Whereas audio and video signal flow is routed between components using cabling 68, the control functions can be provided via an alternate link such as an infrared link. In FIG. 4 an infrared transponder 70 provides this function. The audio/video control 20 sends a command to transponder 70 and the transponder broadcasts that command to each of the components in the system. The infrared command includes a device header indicating which of the components should respond to the command. In one embodiment, the infrared link is bidirectional, allowing components such as the VCR 46 or multimedia computer 52, to send infrared replies back to the audio/video control 20. However, the infrared link may also be unidirectional, as with current remote controls. There are, of course, other ways of communicating control signals between the various components and the audio/video control 20. Infrared has the advantage of being compatible with existing home entertainment equipment. By using infrared control, the audio/video control 20 is able to control the operation of home entertainment components that were designed before the advent of the present technology. Alternatively, the individual component may have infrared networking capabilities so that the remote control 24 can communicate directly with the components without having to go through the audio/video control 20. Thus the video user environment of the invention can be incorporated into existing systems, working with most of the user's existing equipment.

The remote control 24 and control unit 20 preferably employ a form of distributed processing, in which each unit includes a processor that works in concert with the other. In FIG. 4 this distributed architecture is depicted diagrammatically by processor 72, shown as being shared by or related to both the remote control 24 and the control unit 20. Although distributed processing represents the preferred implementation, the video user environment could be implemented by a system in which all of the processing power is concentrated in one of the remote control or control unit devices alone. For example, the remote control 24 could be constructed with minimal processing power and configured to simply relay all hand-drawn instructions of the user to the control unit 20 for interpretation. Such a configuration would require a higher data transfer rate between the remote control 24 and control unit 20. An alternate embodiment places processing power in the remote control 24, so that user-entered, hand-drawn instructions are interpreted in the remote control unit, with higher level instructional data being sent to the control unit 20 for further processing.

Figure 5:
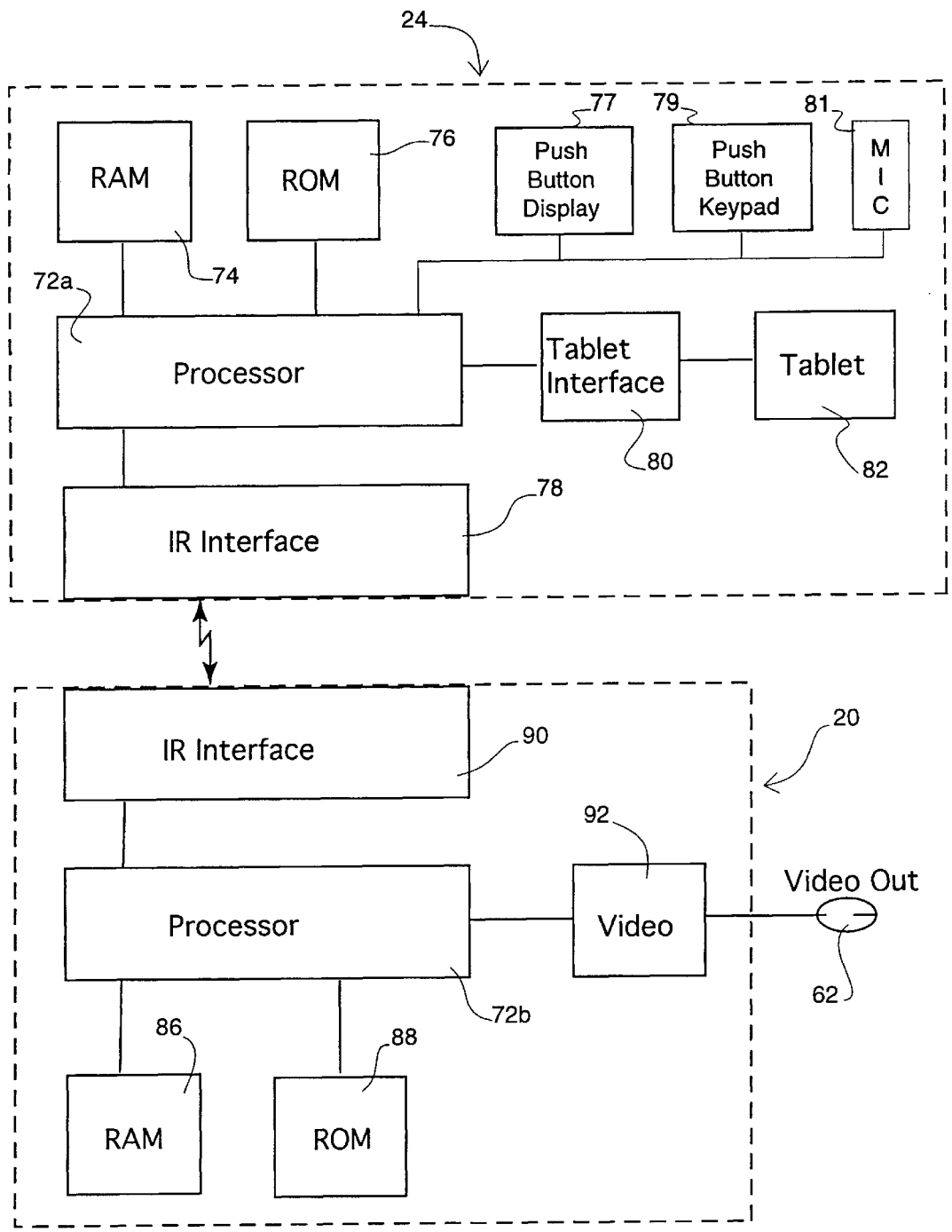
FIG. 5 is a block diagram showing the hardware components of the audio/video control apparatus and remote control apparatus.

FIG. 5 shows the hardware architecture of the preferred implementation. The components of the remote control unit 24 and the audio/video control unit 20 are shown in the dotted line boxes numbered 24 and 20, respectively. The remote control unit includes a processor 72a having local random access memory or RAM 74 as well as read only memory or ROM 76. While these functions are shown separately on the block diagram, processor 72a, RAM 74, ROM 76 and various other functions could be implemented on a single, highly integrated circuit using present fabrication technology. Coupled to the processor 72a is an infrared interface 78. The remote control unit 24 may optionally include a push-button display 77 which provides visual feedback via various light functions and a push-button keypad 79 for providing input to control unit 20. Push-button keypad 79 could have preprogrammed functions or may be programmed by the user, including a learning function which would allow keypad 79 to take on universal functions. Remote control 24 may also be provided with a microphone interface 81 for receiving spoken commands from the user. One skilled in the art will appreciate that processor 72a or 72b may implement well-known voice processing technology for interpreting spoken commands into computer instructions. The remote control unit 24 also includes a digitizing writing surface comprising tablet interface 80 and tablet 82. The tablet interface 80 decodes the user-entered, hand-drawn instructions, converting them into positional or spatial data (x,y data). Processor 72a includes an internal clock such that each x,y data value is associated with a time value, producing a record of the position of the pen or stylus as it is drawn across tablet 82. This space/time data represents the hand-drawn instructions in terms of the "ink" data type. The ink data type is a defined data type having both spatial and temporal components (x,y,t). The ink data type is described more fully below.

The audio/video control unit 20 also includes a processor 72b having associated RAM 86 and ROM 88. Processor 72b is also provided with an infrared interface 90. Infrared interface 90 communicates unidirectionally or bidirectionally (depending on the embodiment) with infrared interface 78 of the remote control 24. In addition to the infrared interface, processor 72b also includes video interface circuitry 92 that supplies the appropriate video signal to the video out port 62.

Figure 6:
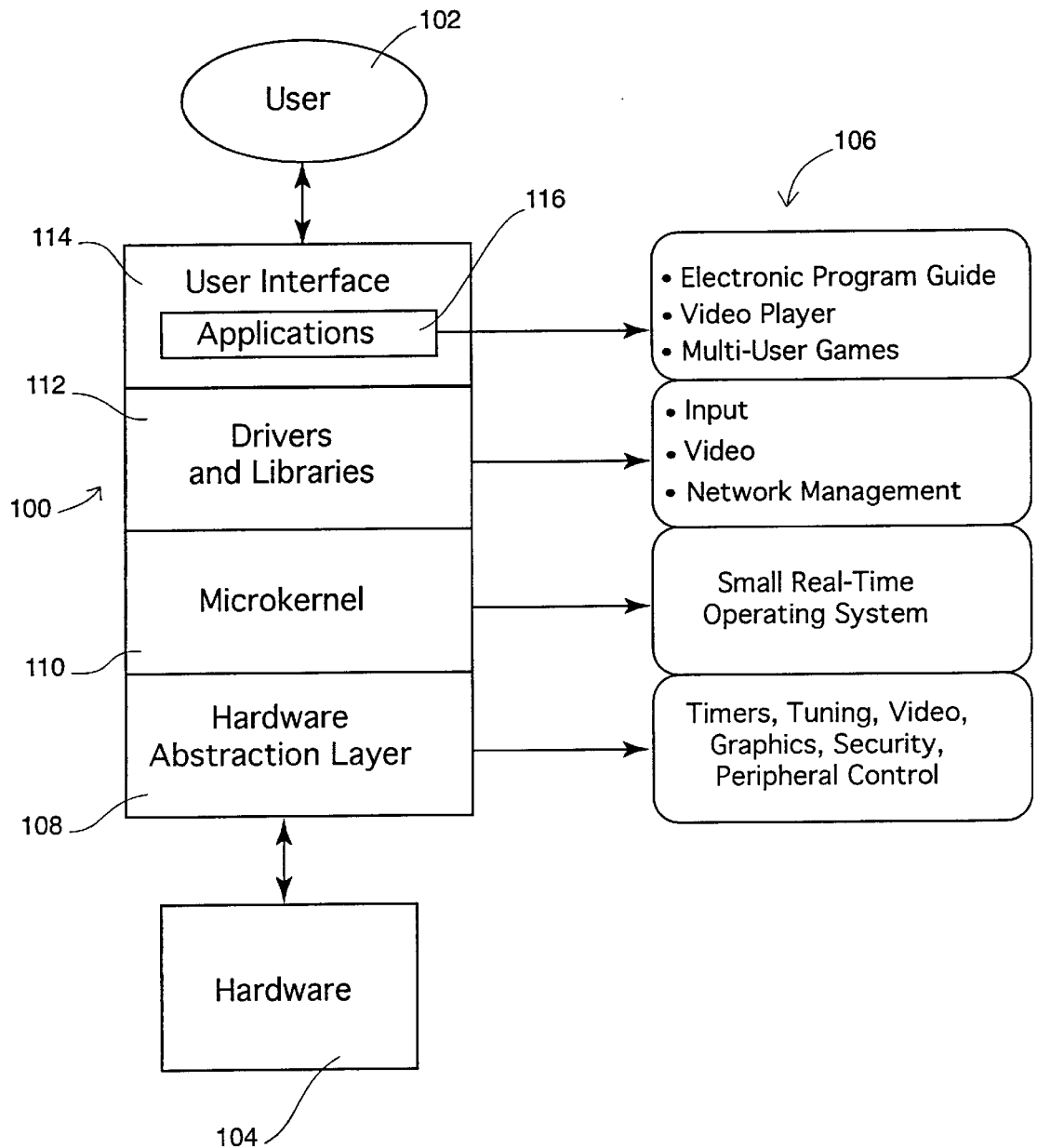
FIG. 6 is a block diagram of the presently preferred software architecture of the invention.

Much of the video user environment is preferably implemented as software that is executed by the distributed processor architecture 72 (e.g. 72a and 72b). The architecture of this software is depicted in FIG. 6. The software can be stored in the read only memories ROM 76 and ROM 88 of the remote control unit 24 and control unit 20, respectively. Alternatively, the software could also be downloaded to random access memories RAM 74 and RAM 86 over various transmission media, including but not limited to, standard telephone lines, fiber optic cable or the television cable that also delivers the video signals.

Referring to FIG. 6, the software component of the invention is depicted diagrammatically at 100. As illustrated, the software component is situated between the user 102 and the hardware 104. The software provides each of the functions depicted generally at 106.

The software component 100 has been illustrated here as the concatenation of several layers. At the lowest layer, closest to the hardware 104, is the hardware abstraction layer 108. This layer provides the connection to the actual hardware 104. The hardware abstraction layer handles hardware-related issues such as implementing timers, tuning television tuners, supporting video and graphics adapter hardware, providing security functions and operating peripherals. The hardware abstraction layer would, for example, include the necessary device driver for the tablet interface 80.

One level above the hardware abstraction layer is the microkernel layer 110. The microkernel layer serves as the real time operating system for the video user environment. The real time operating system employs drivers and libraries, illustrated in layer 112, to produce the higher level input, video and network management functions. The user interface layer 114 is supported by the underlying layers 108, 110 and 112. Applications such as electronic program guide, video player and multiuser games, are run within the user interface layer 114. An exemplary application is illustrated at 116.

Preferred Video User Interface

The preferred video user interface, generated by user interface layer 114, is shown in FIGS. 7–14.

Figure 7:
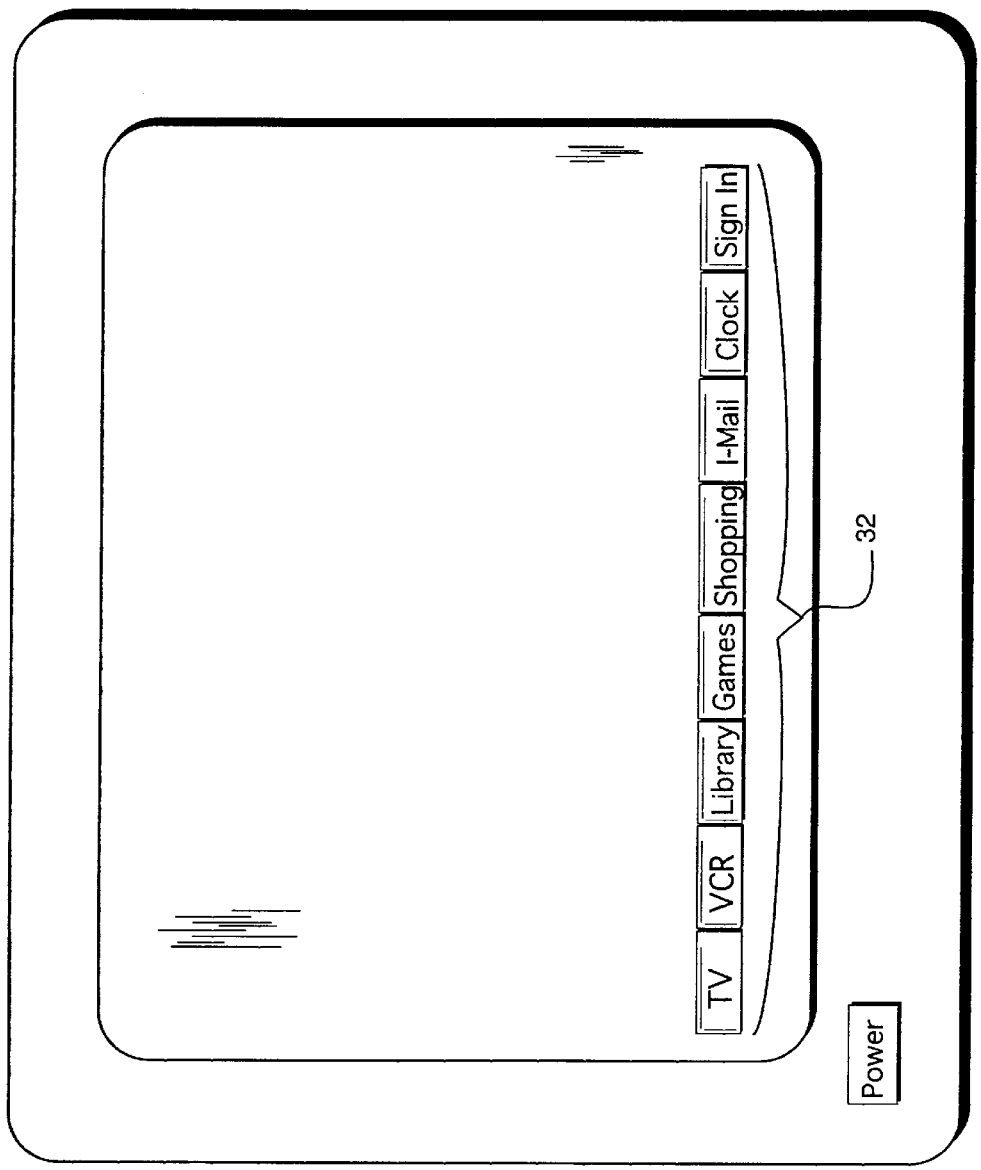
FIG. 7 is a diagram representing a screen snapshot, showing the command bar of the presently preferred user interface.

Referring to FIG. 7, the preferred video user interface presents a command bar 32 preferably at a predetermined location such as at the lower edge of the screen. The command bar provides access to various functions; the preferred command bar provides eight buttons for accessing those functions whose names appear on the buttons. Normally there is no indication that the video user environment is running on a particular video display device or television. During normal viewing operation the video picture fills the entire screen and the command bar 32 is not present. When the user wants to access the video user environment functionality, the user requests the command bar 32 by tapping the pen once anywhere on the digitizing tablet or pressing a button on the remote control unit 24 to make command bar 32 appear on the screen. Another tap of the pen or press of the button causes the command bar to disappear.

Anyone can walk up to a television equipped with the present invention and start using it immediately. However, much of the power of the video user environment comes from the ability to create personal annotations. For example, a user might draw a short descriptive pictogram to mark a favorite channel.

Figure 8:
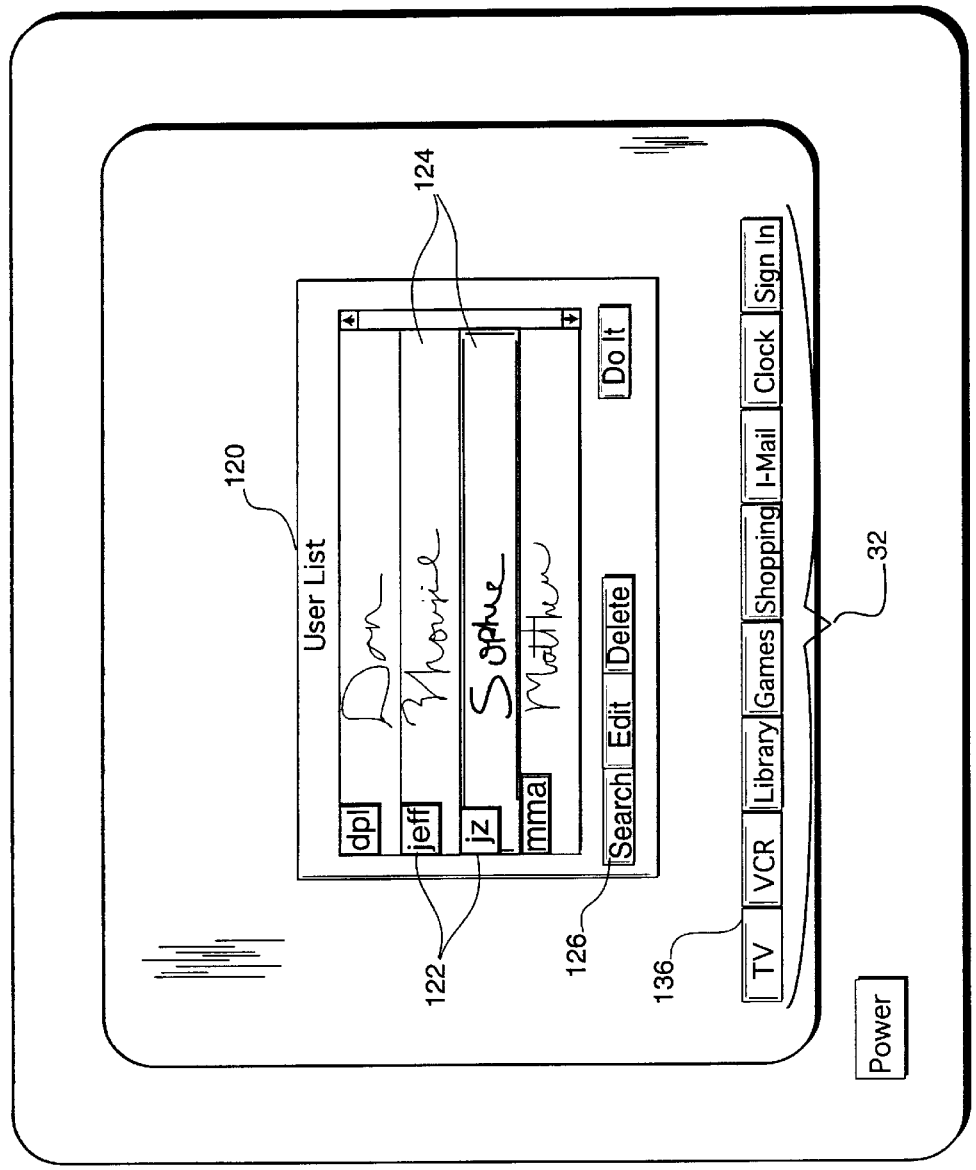
FIG. 8 shows the sign-in panel of the presently preferred user interface.

Before such personalized data can be made available the user must identify himself or herself to the system. This is accomplished by selecting the "Sign In" button on the command bar by tapping it once. This brings up a panel shown in FIG. 8 through which the user may sign in. The panel comprises a user list 120 on which two types of information are displayed: a text string 122 and an associated ink region 124. The identity of each user is symbolized by the text string and its associate ink region. As illustrated, the ink region may not necessarily duplicate the text. In FIG. 8 the text string JZ identifies the user who has signed her name as "Sophie" in the ink region. The ink region is entirely unconstrained: it can be a picture, a doodle, a signature, a word written in any language and so forth. There is explicit binding between the ink region and the text string, such that the bound pair is understood by both the system and the user as identifying a single individual. The linking of the ink region and the text string forms a data structure often referred to as a tuple. This same paradigm carries through a number of the video user environment applications to be discussed.

Once the Sign In panel is on screen the user may select an ID by tapping on it. Tapping the "Do It!" button completes the action, logging in the user as the indicated ID. Alternately, the user may search for a specific ID using a searching feature of the invention discussed below. The searching feature uses an approximate ink matching technique, thus the user does not need to sign in precisely the same way each time. The system is flexible enough to accommodate normal handwriting variations.

The Sign In panel also offers the option of adding, deleting or editing a user ID. These operations are modal, meaning that they apply to a specific ID instance. Thus the "Edit" button is only active when an ID is selected.

Figure 9:
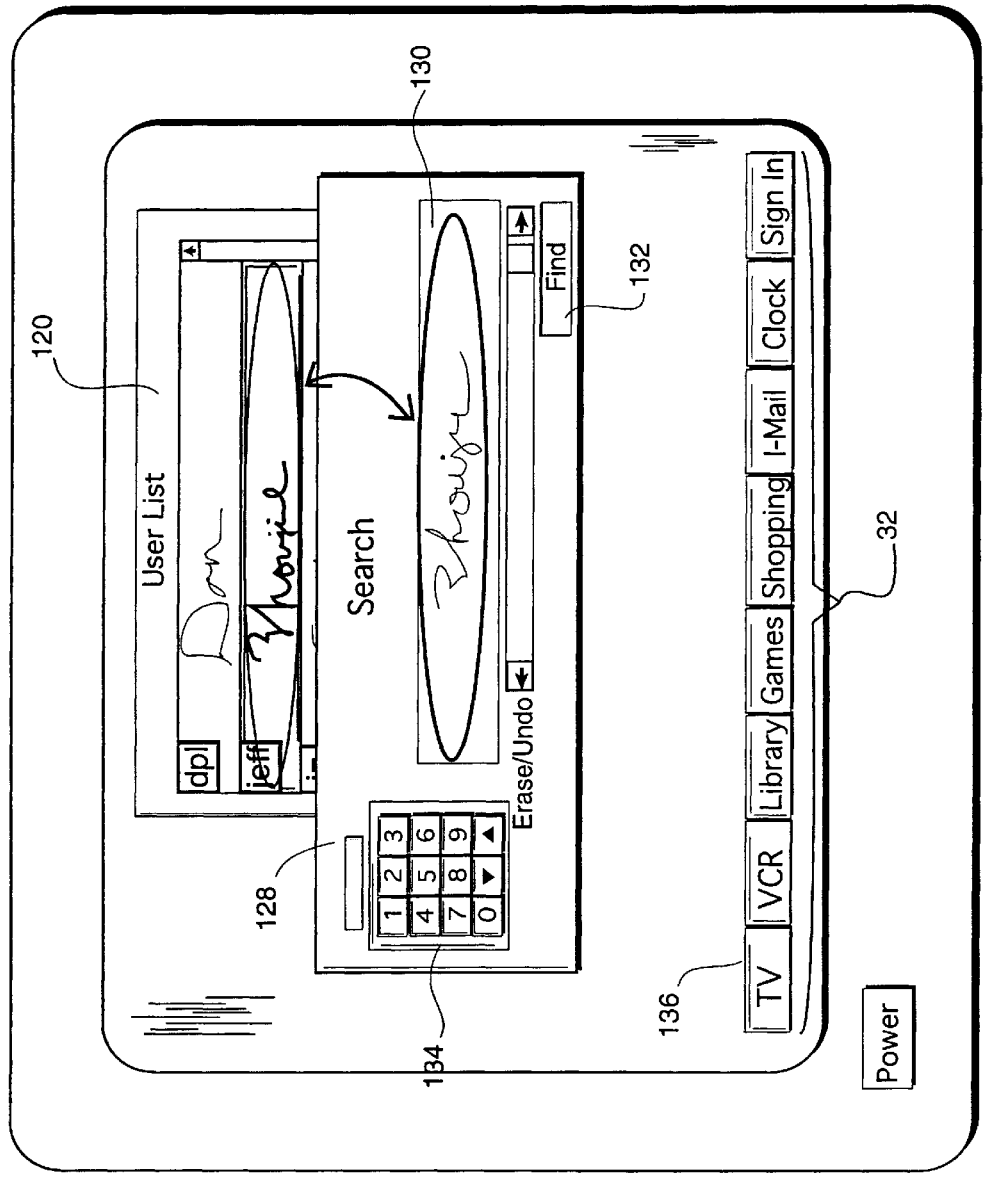
FIG. 9 shows an example of an ink search in the sign-in panel of the preferred user interface.

The system is capable of performing the approximate ink matching search on a user entered hand-drawn annotation. By tapping on the Search button 126 a search dialog box 128 is presented as illustrated in FIG. 9. The user enters a hand-drawn entry or annotation in the ink region 130 and this entry is compared with the ink data previously stored as user IDs. The approximate ink matching system of the invention identifies the best match and highlights it in the user list 120 as shown. If the user determines that the highlighted entry is not correct, the user may proceed to the next best match by typing the "Find" button 132 again. The process can be repeated until the desired ID is found.

As an alternate searching technique, the user can search for the ID based on the entry in the text string region 122. This is done by typing the desired text string using a soft keyboard brought up by tapping on the keyboard icon 134. The keyboard icon preferably appears as a standard QWERTY keyboard resembling a conventional keyboard found on a personal computer. When the keyboard is used to enter a text string, the system finds an exact match in the list of IDs by searching for the character string entered by the user. Like the ink search, the text matching search can also be approximate. Thus if the user enters the query "ddl" the text string "dpl" would be considered a better match than the text string "jeff."

After the user has signed in with the user list screen, a briefly displayed confirmatory screen is projected showing the text and ink data representing the ID through which the user has signed in. Also, if desired, the time of day may also be momentarily displayed. After the confirmatory screen has been displayed for a suitable length of time (e.g. five seconds) it disappears, leaving only the current video screen visible. In the event the user chooses not to sign in, the system assumes that the last entered user ID is applicable by default.

The video user environment of the invention provides a full complement of standard television controls such as volume, balance, brightness, color and so forth. In addition, an on-screen keypad is available for changing channels by direct entry of the numeric channel number or by "surfing"

up and down the dial by clicking suitable up and down buttons. The standard television controls are presented by tapping the TV button 136 on command bar 32.

The presently preferred implementation continues to use the traditional remote control push buttons for performing standard television control functions such as those listed above. For continuity and maximum flexibility, these same functions are duplicated on screen through the video user interface.

Figure 10:
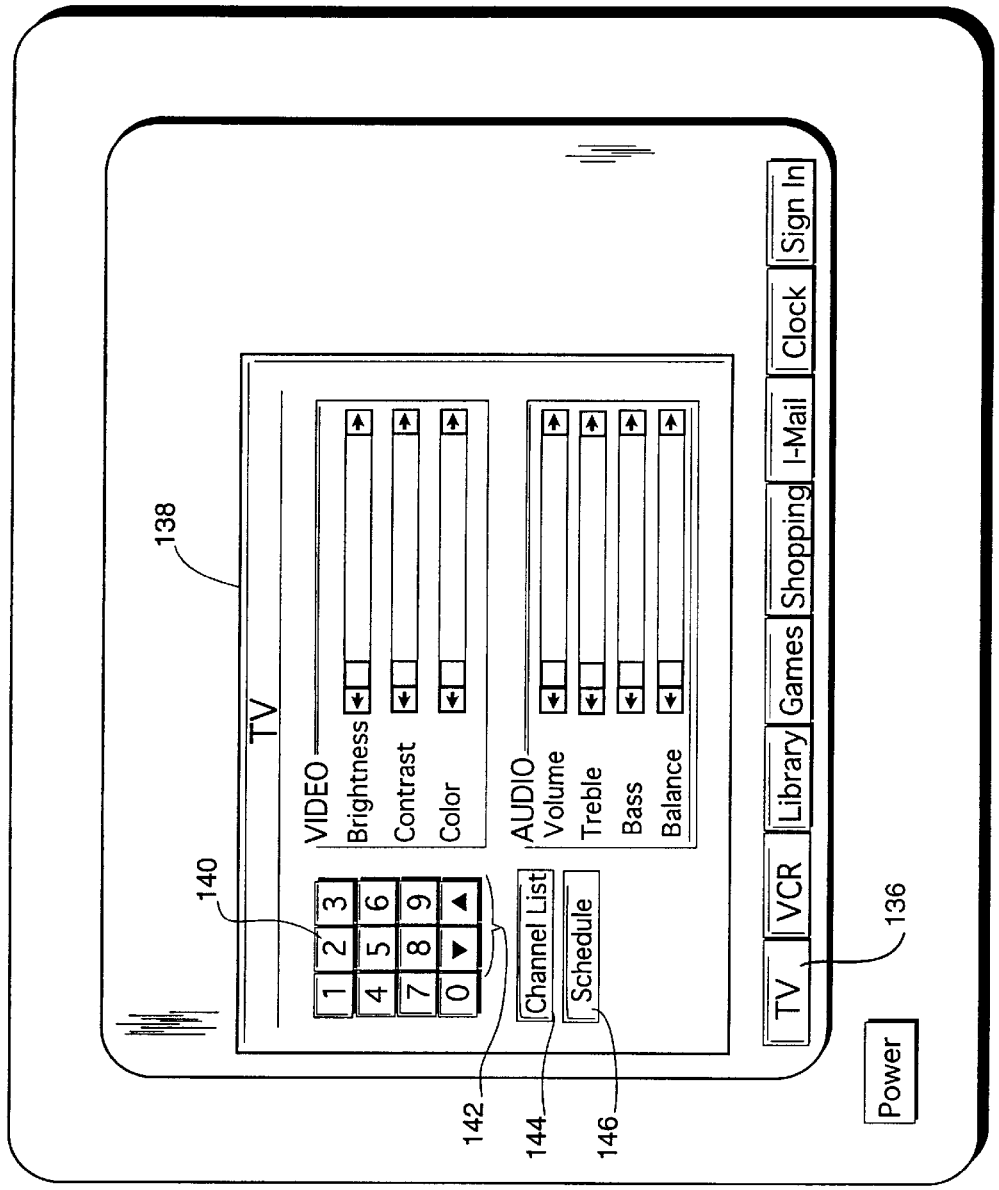
FIG. 10 illustrates standard television controls available for manipulation through the user interface by selecting the TV button on the command bar.
Figure 11:
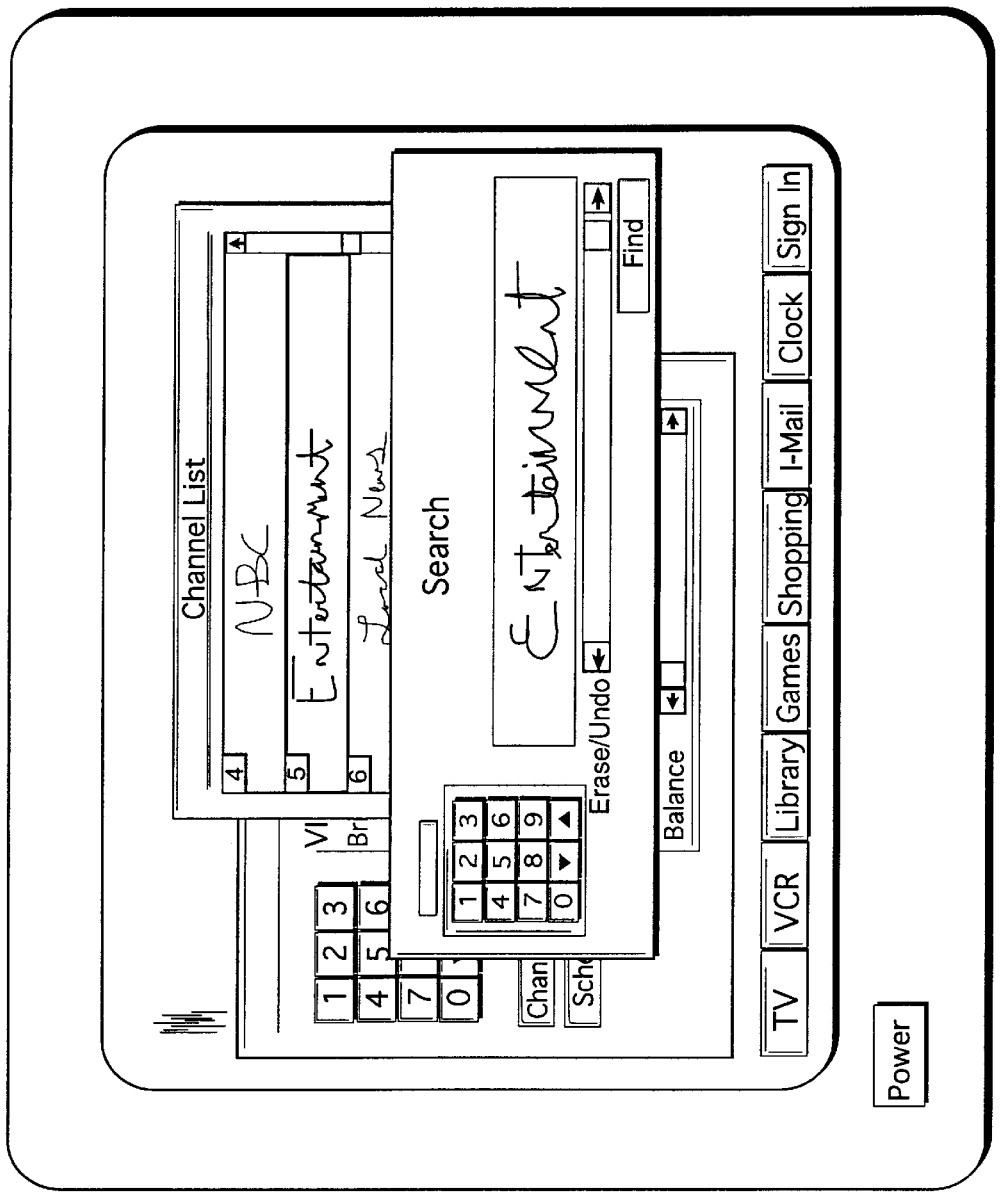
FIG. 11 illustrates an example of a TV channel search using approximate ink matching.
Figure 12:
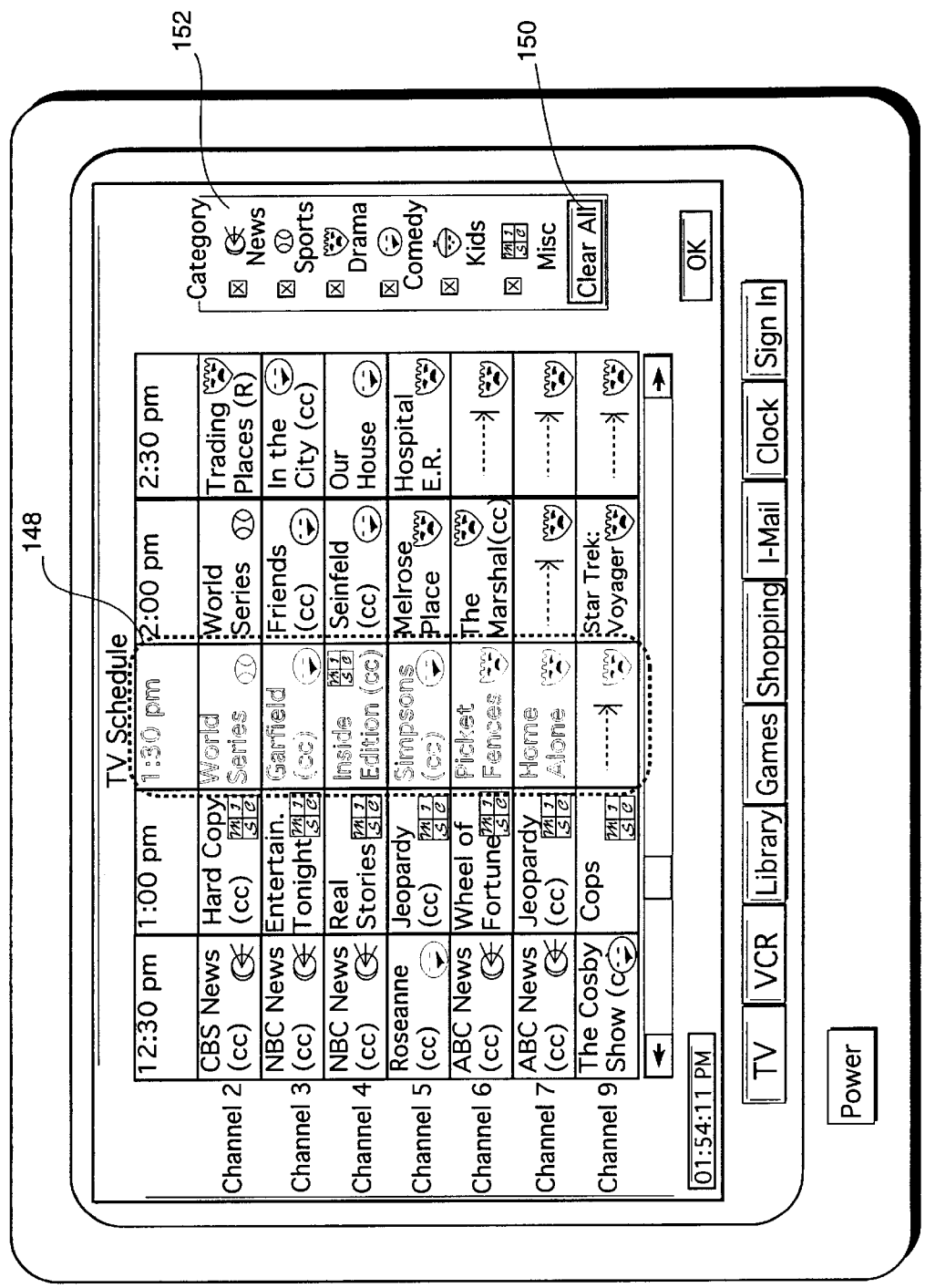
FIG. 12 shows a TV program schedule as presented through the user interface.
Figure 13:
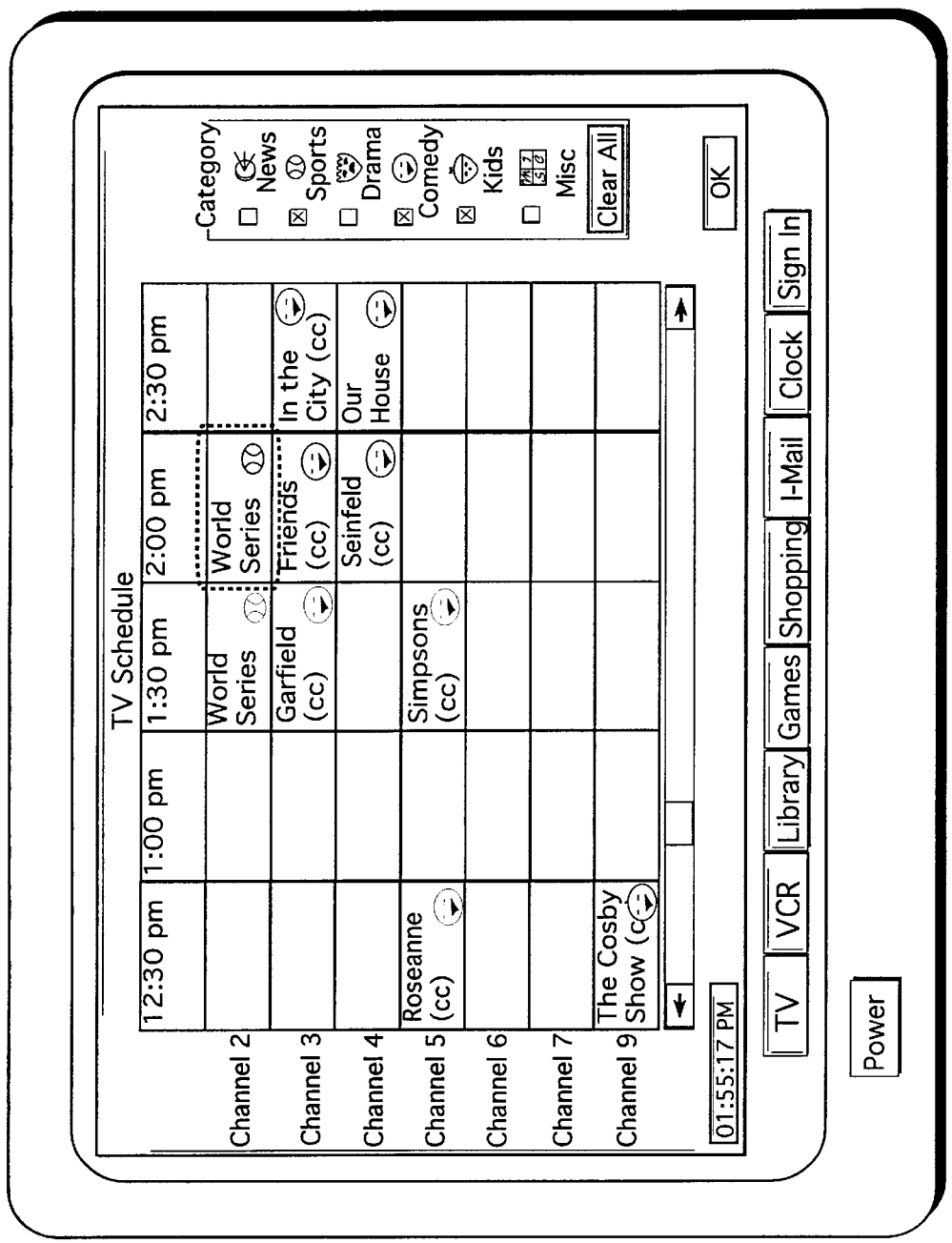
FIG. 13 shows a similar TV program schedule that has been limited to display only certain categories by manipulation through the user interface.

Although the video user interface provides the same ability to control standard television control functions as the traditional remote control, the video user interface of the invention goes far beyond the traditional remote control. The invention provides sophisticated tools to help the user manage his or her video programming. FIG. 10 shows the television control panel 138 that is displayed when the TV control button 136 is tapped. The numeric keypad 140 is used to enter television channels directly and the up and down buttons 142 sequentially surf through the channels in forward and backward directions. By tapping on the channel list button 144 brings up a scrollable list of channels with handwritten annotations as illustrated in FIG. 11. As with the sign in panel, it is possible for the user to select an item manually or search for an item using the approximate ink or text matching techniques. In this case, the numeric pad 140 (accessed by tapping on the appropriate numeral icons) limits the user to numeric input (i.e. TV channels). Tapping on the "Schedule" button 146 displays a convenient television schedule illustrated in FIG. 12. The preferred implementation portrays the TV schedule in the form of a traditional paper-based television guide. It has the distinct advantage, however, of knowing what time it is. Thus, the TV schedule screen (FIG. 12) highlights programs currently playing, to assist the user in making a choice. Thus the TV schedule of FIG. 12 is an active schedule capable of highlighting which are current programs, updating the display in real time. In FIG. 12 the active programs are designated by dotted lines at 148 to indicate highlighting. The present invention carries the concept of active scheduling one step further, however. Each program in the display is tagged with a predefined icon indicating its genre. Thus news, sports, drama, comedy, kids and miscellaneous may be designated. The user may limit the TV schedule to display only those programs in certain genres by tapping the "Clear All" button 150 and by then activating one or more of the check boxes in the category pallet 152. In the example shown in FIG. 13, the user has elected to limit the display of programs in the sports, comedy and kids categories. This feature in the video user environment makes it much easier for the user to identify which programs he or she wants to watch.

Finally, the TV schedule allows the user to program the TV to change channels at specific times automatically. Thus the user does not miss an important show. Unlike programming of current VCRs, which can be complicated and frustrating, programming in the video user environment is handled in a highly intuitive way. The user simply taps on a show displayed in the schedule (such as "World Series" in FIG. 13), thereby highlighting it. Then, at the appropriate time, the video user environment switches to the proper channel (in this case channel 2). As with all video user environment applications, ease of use is key.

Figure 14:
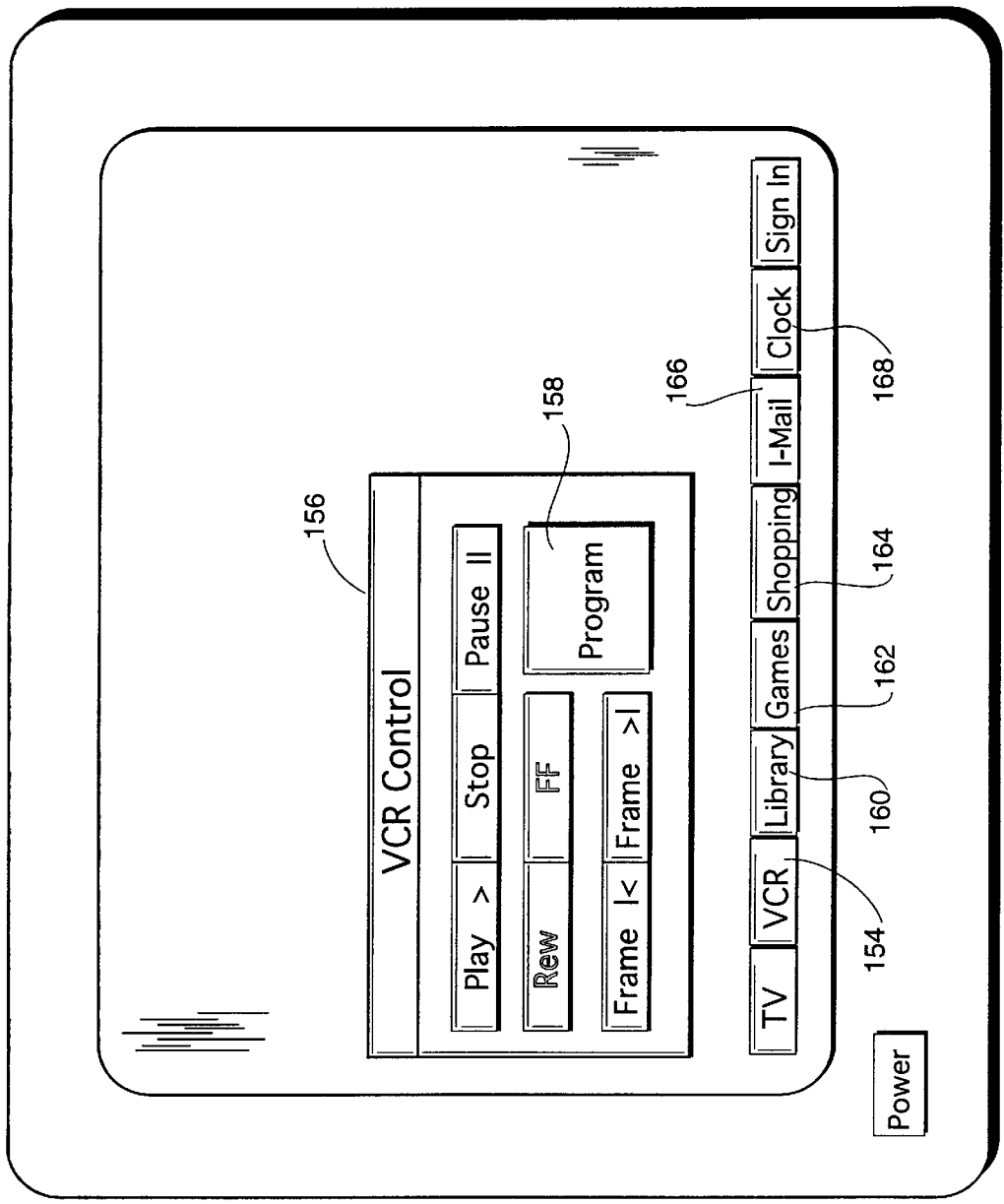
FIG. 14 shows a VCR control function display produced by selecting the VCR button on the command bar.

The foregoing has described how the video user environment may be used to access and control television. Similar capability is provided for other audio and video components such as the VCR. FIG. 14 depicts the VCR control panel 154 that is displayed when the VCR button 156 is tapped. The VCR control panel provides traditional play, stop, pause, rewind and fast forward control. In addition, if the VCR equipment is capable of such functionality, the VCR tape can be indexed forward or backward on a frame-by-frame basis. Similar capabilities can be provided for controlling laser disc players, for example.

As best illustrated in FIG. 14, tapping the "Program" button 158 calls up a display visually identical to the TV schedule display of FIG. 12. However, the TV schedule and the VCR schedule are maintained as separate data structures, so that the user may program the TV and VCR independently. Using the same visual displays for different but comparable functions is one way the presently preferred implementation makes the system easier to use. By reusing the same icons and tools (including the same window layouts, locations and function of buttons) speeds the learning process, as the user only needs to have experience with one instance of the tool to know how to apply it in its other settings. This also makes the video user environment application smaller, as code can be shared among several functions.

Tapping on the "Library" button 160 (FIG. 14) brings up yet another browser displaying text and ink annotations in pairs. Similar in appearance to the channel list of FIG. 11, the video library displays entries that correspond to specific video programs that the user can view at will. Thus the video library can serve as an interface to a video on demand system or to recordings in the user's own personal collection. For example, the user might enter "Nightly News" in the video library, keying it to a particular video on demand selection. Alternatively, the user may call up a memorable sporting event such as "Bob's Favorite Yankee Game." Thus the user could later search through the entries in the video library and select an archived event by tapping on it. This would in turn cause the video on demand system to commence delivery of the news or other entertainment program to the user. As video on demand systems become more sophisticated, this capability can be quite valuable. For example, the user might wish to use the video library to review nightly news programs for the week he or she was on vacation and unable to watch the news. Or, the user might wish to use this video library to call up previous sporting events from the video on demand system.

Figure 15:
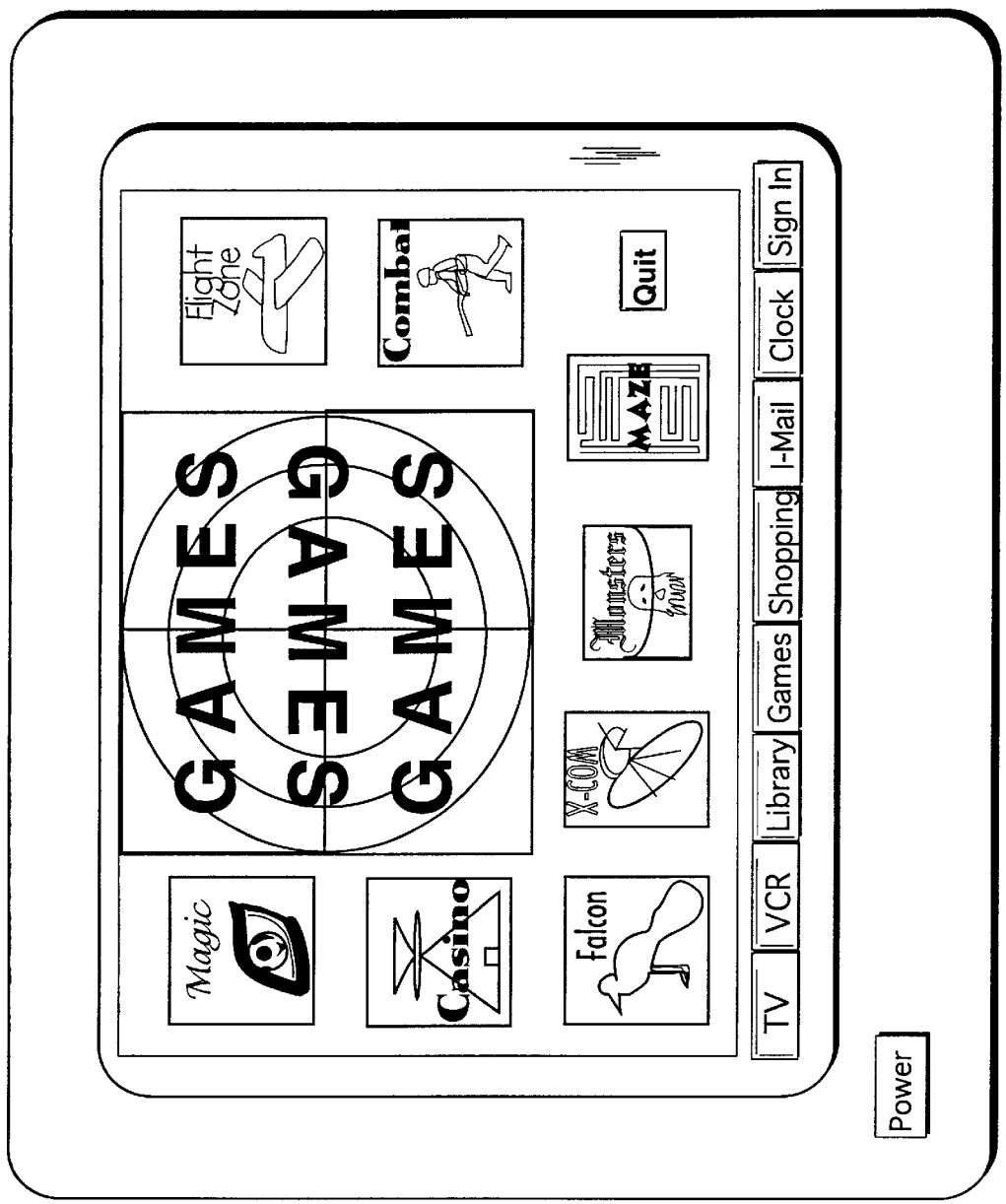
FIG. 15 shows an example of the video game quick access interface.

Tapping the "Games" button 162 (FIG. 14) brings up a window (FIG. 15) that provides a quick and easy interface for a user (even a child) to access a variety of on-line games. Some of these games may involve other players on a network. The presently preferred embodiment of the video user environment does not directly implement any of these games, as it is contemplated that such games would be supplied by commercial software developers. The preferred interactive games interface simply displays a plurality of icons to represent each of the available games on the user's system.

Figure 16:
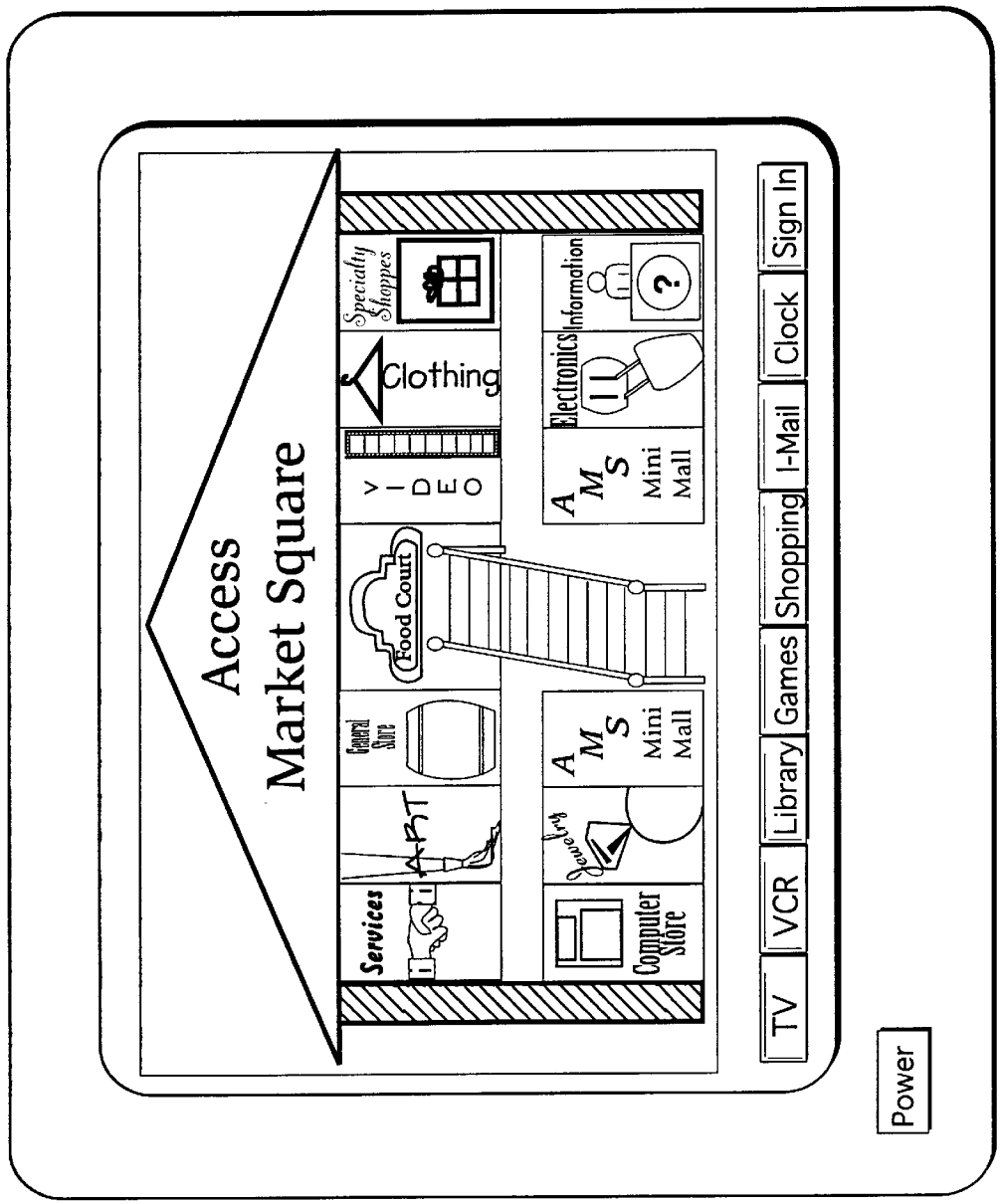
FIG. 16 shows an example of the home shopping access interface.

Tapping on the "Shopping" button 164 calls up a display of home shopping options (FIG. 16). Preferably each option is displayed as a separate icon that the user may tap on in order to access those shopping services. If desired, the shopping button could call up a web site on the Internet that could be used as a starting point for supplying hypertext links to other shopping locations.

Figure 17:
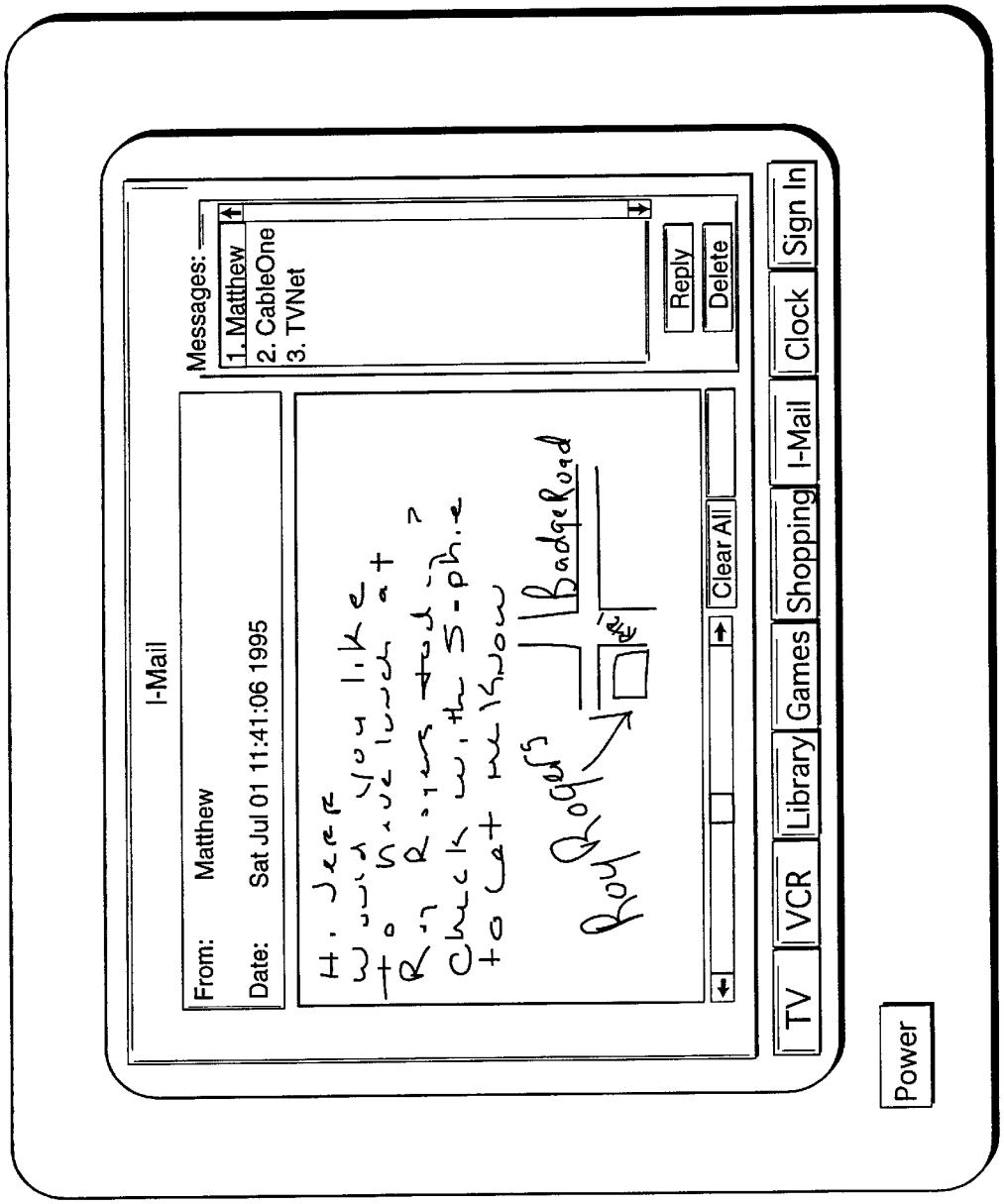
FIG. 17 shows an example of the ink mail (I-mail) user interface.

Tapping on the "I-Mail" button 166 (ink-mail) provides the user with an electronic mail communication system. In contrast with conventional E-mail systems that rely on keyboard-entered text, the video user environment allows the user to send hand-drawn or handwritten messages. The I-mail interface (FIG. 17) preferably provides a notepad area into which the user can draw handwritten messages that may then be sent via the Internet or other suitable communication network to a recipient. These handwritten messages allow for more personalized correspondence and are more accessible than typed electronic mail. Additionally, writing with a pen is more powerful. For example, a user can begin writing an I-mail text message and then switch to drawing a map without changing tools as is required with current keyboard/mouse-based electronic mail systems.

As discussed above, the video user environment has access to a system clock whereby the TV schedule and VCR schedule are made active. The clock button 168 (FIG. 14) may be tapped to call up a screen in which the user can set the correct date and time of day of the system.

Preferred Ink Search and Retrieval Technology

The preferred embodiment uses an approximate matching procedure to identify and rank possible hand-drawn "ink" entries made by the user using the digitizing tablet and pen. The approximate matching procedure is a fuzzy search procedure that identifies and ranks possible substring match candidates based on a scoring and ranking distance between the query and the candidate. The procedure produces a score for each candidate, allowing the candidates to be ranked in order of "goodness."

One benefit of the approximate matching procedure is that any line breaks in the user-drawn entry or query have no impact on the ink search. Line breaks in writing are ignored, so that the user does not have to remember where the line breaks may have occurred in the original entry.

Figure 18:
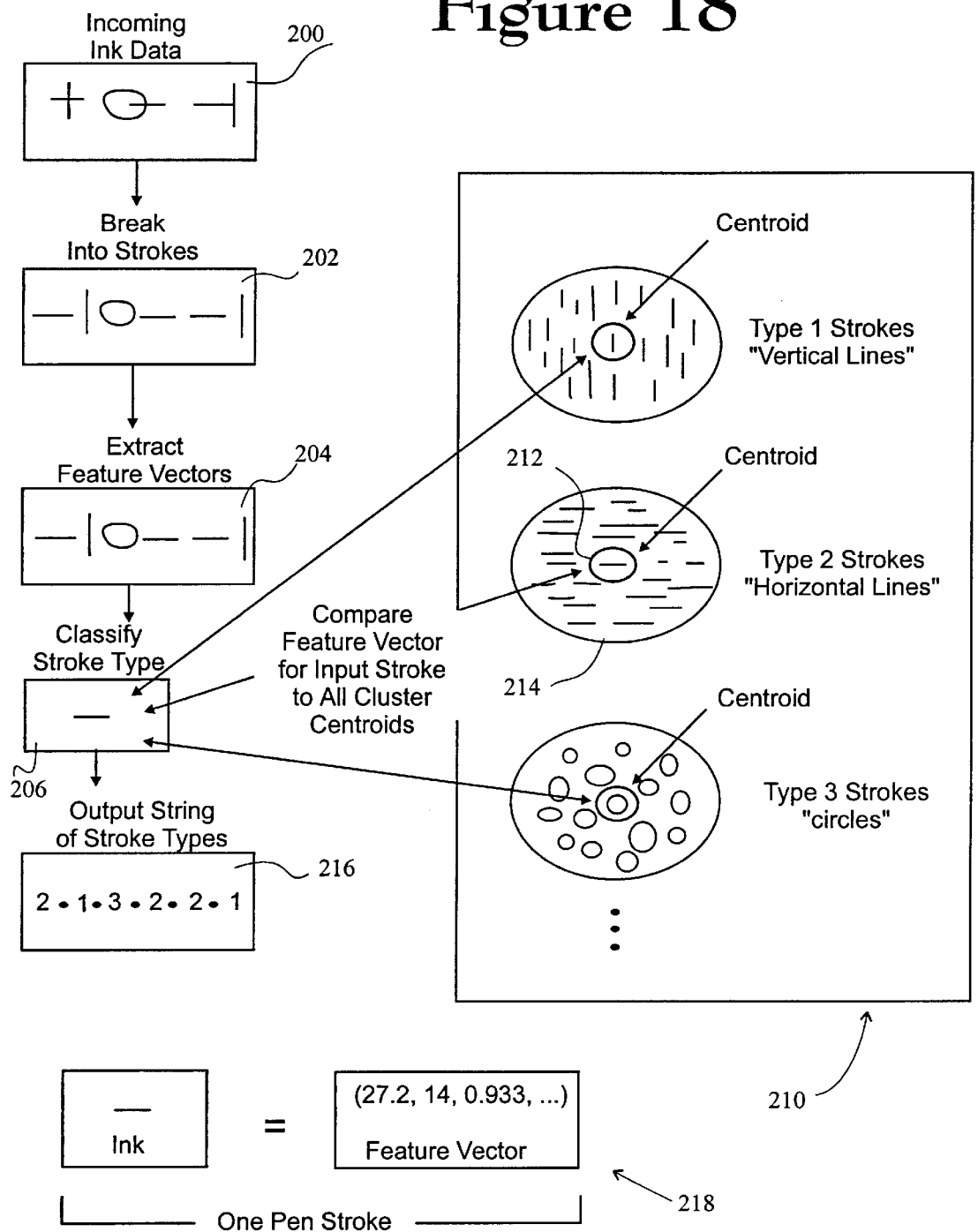
FIG. 18 is a flow diagram describing the ink data interpretation that forms part of the recognition system.

The fuzzy search technique of the preferred embodiment uses a vector quantized (VQ) representation of the user-drawn entry to capture and compare pen strokes of the ink data type. The ink data type is a system defined data type that captures the precise (X,Y) position of the pen tip over time as the user writes or draws an annotation or entry. Thus the ink data type captures not only the spatial position of the ink, but also the temporal sequence over which the ink is "applied" as the user draws the entry on the digitizing writing surface. FIG. 18 gives an overview of the manner in which pen stroke classification is performed using vector quantization. The ink data type records the motion of the pen tip over the surface of the digitizing tablet as a string of (X,Y) ink points. The individual (X,Y) ink points are sequentially captured, thereby preserving the temporal or time-based component of the data. Thus the ink data type may be considered as comprising (X,Y,T) vectors.

As illustrated in FIG. 18, the incoming ink data 200 are broken into strokes as at 202. Segmenting the ink data into strokes allows each stroke to be analyzed separately. By way of illustration, FIG. 18 shows that the plus sign (+) in the incoming data 200 was drawn by the user, first forming a horizontal line and then forming a vertical line. This is illustrated at 202 by reading the segmented data at 202 from left to right.

After stroke segmentation the individual strokes are then analyzed to extract feature vectors. This is shown diagrammatically at 204. In FIG. 18, the extracted feature vectors are shown graphically to simplify the presentation. In the actual embodiment, the extracted feature vectors are represented as numerical data that is stored in the computer. As indicated at 206, each extracted feature vector is classified according to a predetermined code book 210. The presently preferred embodiment stores 64 clusters of stroke types, each cluster being represented by its centroid or average stroke of that type. As in the case of the extracted feature vectors (block 204) the feature vector clusters are stored as numerical computer data. In FIG. 18 the data comprising code book 210 are shown graphically (instead of numerically) to simplify the presentation. In FIG. 18 note that the horizontal line segment of block 206 most closely matches the centroid 212 of the Type 2 stroke cluster 214. Thus in the output string (block 216) the VQ code 2 is used to represent the horizontal line in block 206. In block 216 the leftmost numeral 2 corresponds to the leftmost horizontal line stroke. The remaining codes represent the remaining ink strokes comprising the original incoming ink data.

Through the above-described procedure the incoming ink data is converted, pen stroke by pen stroke, into a feature vector that corresponds to each individual pen stroke. The set of feature vectors which collectively represent a series of pen strokes are stored in the computer database as the user-drawn annotation. This is depicted at 218.

Figure 19:
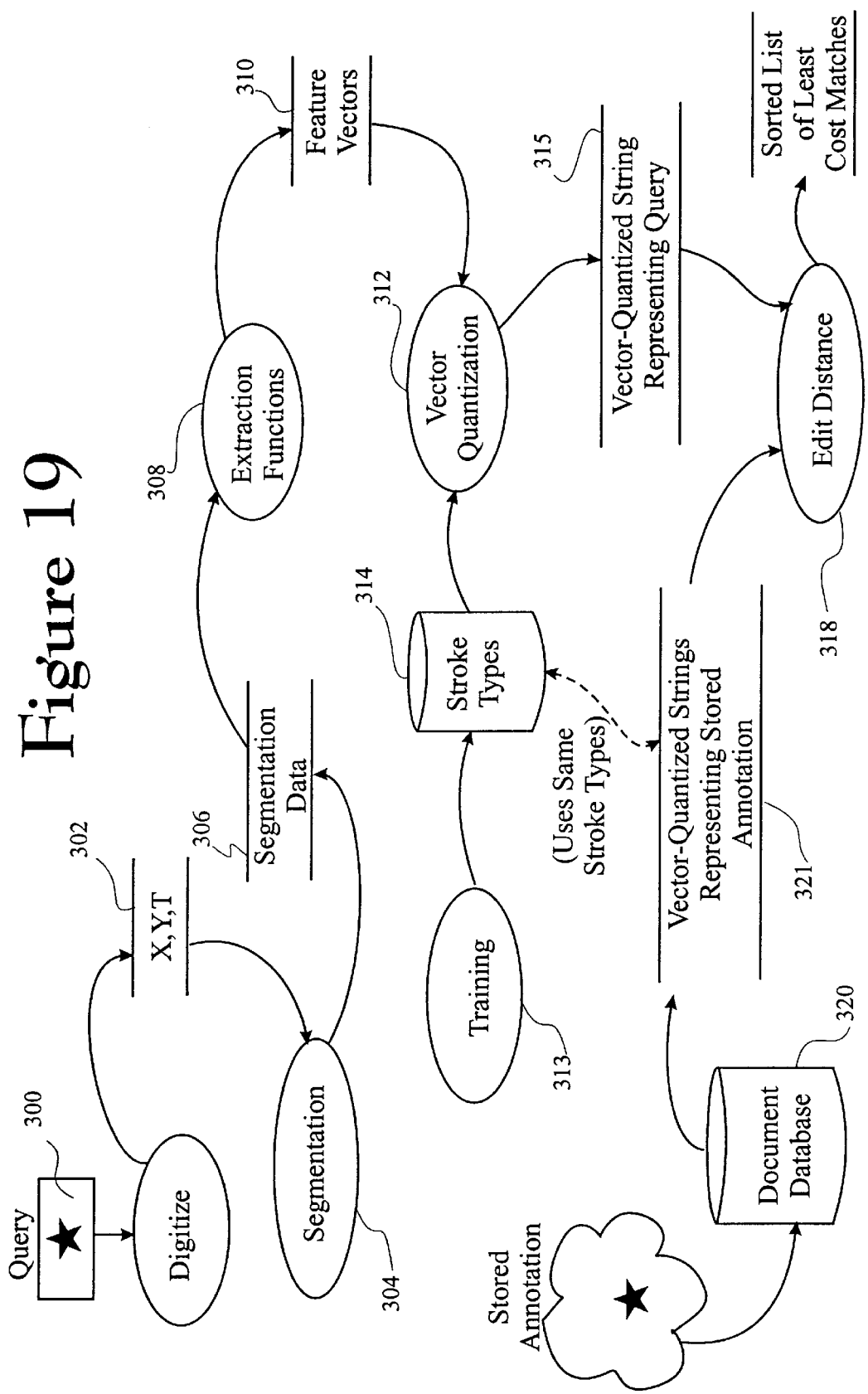
FIG. 19 is an entity relationship diagram illustrating the steps that the system performs in searching for a user-drawn entry or annotation.

To further illustrate, a software block diagram of the presently preferred embodiment is shown in FIG. 19. The annotation system operates on digitized pen stroke data that is ultimately represented as an "ink" data type. As will be illustrated, it is not necessary to convert the ink data type into an ASCII character data type in order to perform the search and retrieval procedures. Indeed, in the case of graphical (nontext) annotations, conversion to ASCII would have no meaning. Thus, a significant advantage is that the annotation system operates in a manner which allows the "ink" data to be language-independent.

Illustrated in FIG. 19, the user-drawn query 300 is captured as a string of (X,Y) ink points, corresponding to the motion of the pen tip over the surface of the digitizing tablet or pad as the user draws query 300. The presently preferred embodiment digitizes this information by sampling the output of the digitizing pad at a predetermined sampling rate. Although a fixed sampling rate is presently preferred, the invention can be implemented using a variable sampling rate, as well. By virtue of the digitized capture of the X,Y position data, both spatial and temporal components of the user-drawn pen strokes are captured. The temporal component may be implicit information—the ordering of sampled points relative to one another conveys temporal information. Alternatively, the temporal component may be explicit —the exact time each point was sampled is captured from an external clock.

In the presently preferred embodiment, employing a fixed sampling rate, each X,Y data point is associated with a different sampling time. Because the sampling rate is fixed, it is not necessary to store the sampling time in order to store the temporal data associated with the pen stroke. Simply recording the X,Y position data as a sequence automatically stores the temporal data, as each point in the sequence is known to occur at the next succeeding sampling time.

In the alternative, if a variable sampling rate system is implemented, (X,Y,T) data is captured and stored. These data are the (X,Y) ink points and the corresponding time T at which each ink point is captured.

The raw ink point data is stored in data store 302. Next, a segmentation process 304 is performed on the stored ink point data 302. The presently preferred segmentation process searches the ink point data 302 for Y-minima. That is, the segmentation process 304 detects those local points at which the Y value coordinate is at a local minimum. In hand-drawing the letter "V" as a single continuous stroke, the lowermost point of the letter "V" would represent a Y-minima value.

Segmentation is performed to break the raw ink point data into more manageable subsets. Segmentation is also important for minimizing the variation in the way the users produce ligatures; the connection of characters or even words. These segment subsets may be designated using suitable pointers to indicate the memory locations at which the Y-minima occur. In this case, these segmentation pointers may be stored at 306 to be associated with the ink point data 302 previously captured. In the alternative, if desired, the segmented data may be separately stored in one or more memory buffers instead of using pointers.

Once the raw data has been segmented the individual segments or pen strokes are operated on by a set of extraction functions 308. The presently preferred embodiment operates on the pen stroke (segment) data using 13 different extraction functions. These extraction functions each extract a different feature of the pen stroke data that are then used to construct a feature vector. Table I lists the presently preferred features that are extracted by the extraction functions 308. For further background information on these extraction functions, see Rubine, Dean, "Specifying Gestures by Example," *Computer Graphics*, Vol. 25, No. 4, July 1991. The feature vectors of a given stroke are diagrammatically represented in FIG. 19 at 310.

TABLE I $$f_1 = \frac{x_2 - x_0}{\sqrt{(x_2 - x_0)^2 + (y_2 - y_0)^2}}$$

$$f_2 = \frac{y_2 - y_o}{\sqrt{(x_2 - x_0)^2 + (y_2 - y_0)^2}}$$

$$f_3 = \sqrt{(x_{max} - x_{min})^2 + (y_{max} - y_{min})^2}$$

$$f_4 = \arctan\left(\frac{y_{max} - y_{min}}{x_{max} - x_{min}}\right)$$

$$f_5 = \sqrt{(x_{P-1} - x_0)^2 + (y_{P-1} - y_0)^2}$$

$$f_6 = \frac{x_{P-1} - x_0}{f_5}$$

$$f_7 = \frac{y_{P-1} - y_0}{f_5}$$

Let $\Delta x_P = x_{P+1} - x_P$ and $\Delta y_P = y_{P+1} - y_P$ and $\Delta t_P = t_{P+1} - t_P$ $$f_8 = \sum_{P=0}^{P-1} \sqrt{\Delta x_P^2 + \Delta y_P^2}$$

$$f_9 = \sum_{P=1}^{P-2} \theta_P$$

$$f_{10} = \sum_{P=1}^{P-2} |\theta_P|$$

$$f_{11} = \sum_{P=1}^{P-2} \theta_P^2$$

$$f_{12} = \max_{P=0}^{P-2} \frac{\Delta x_P^2 + \Delta y_P^2}{\Delta t_P^2}$$

$$f_{13} = t_{P-1} - t_o$$

Where P represents the total number of points.

The extracted feature vectors represented at 310 are then coded or quantized by comparison with a predetermined set of clusters of stroke data types. The feature vector data 310 is quantized by vector quantization process 312 to assign each cluster to the closest predetermined stroke type. In this regard, the presently preferred embodiment defines 64 different stroke types that are each represented by a different name or number. Although the presently preferred system uses 64 different stroke types, the principles of the invention can be employed with a greater or fewer number of stroke types.

The predetermined stroke types are arrived at during a training procedure 313. The training procedure may be used to predetermine a vector quantization (VQ) code book 314 that is then used for multiple users. In many commercial implementations it will be desirable to train the system at the factory, using a set of user-independent training data. Alternatively, the training procedure can be used prior to use by an individual user. Both applications work well. In either case, the system is still user-dependent because there can be a great deal of variation in the way two different people draw the same annotation. Thus the preferred embodiment is best suited to searching one's own annotations.

It will be appreciated that in most cases the user will not draw the same annotation in precisely the same way each and every time. That is, the (X,Y,T) coordinates and temporal properties of a given annotation may vary somewhat, each time the user draws that annotation. The presently preferred system accommodates this variation first by the manner in which the vector quantization is performed. Specifically, the vector quantization process 312 assigns each input stroke to the predetermined vector from the user-dependent stroke types 314 that represents the closest match.

After each of the strokes representing the query has been processed in this fashion, a comparison is made between those strokes and the user-drawn annotations that have been stored in association with the documents in the database 320. Thus, for example, the query "important" may be compared against the stored annotation "this is very important!" An edit distance analysis is performed to make this comparison.

Shown as edit distance analysis process 318, the query stroke type string is compared with each of the stored annotation stroke type strings 321 of the database 320. The edit distance analysis compares each stroke type value in the query string with each stroke type value in each of the annotation strings. A edit distance computation is performed by this comparison, yielding the "cost" of transforming (or editing) one string into the other. The individual string/string comparisons are then ranked according to cost, with the least cost resultants presented first. In this way, a sorted list comprising all or the n-best matches is displayed in the thumbnail sketches of the main browser screen. Alternatively, rather than showing a sorted list, the user may be shown the best match on the main browser screen. If the user determines that this match is not correct, the user may tap the "Next" button (not shown) to see the next best match.

Figures 20, 21:
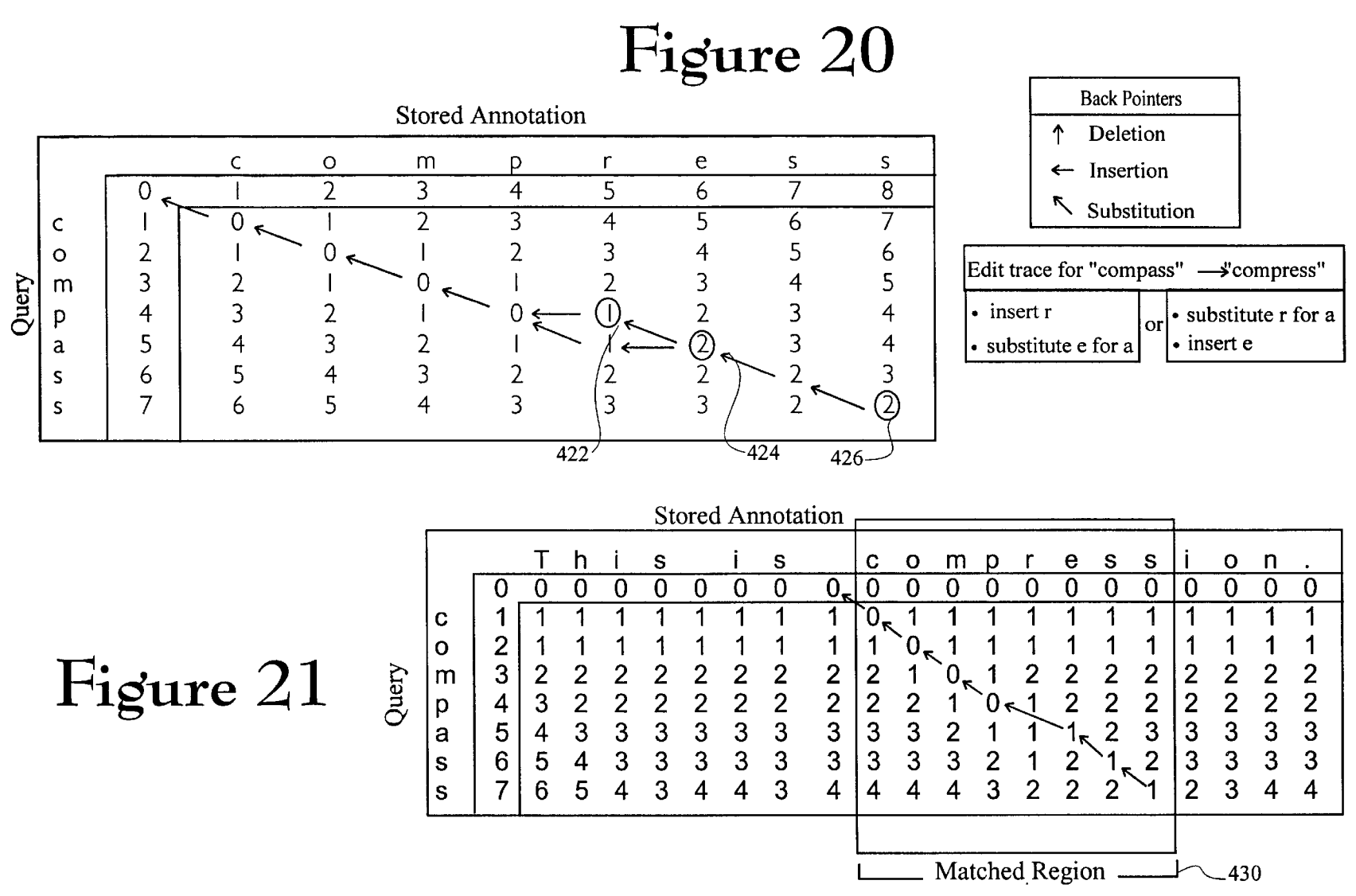

FIG. 20 shows the basic edit distance technique. In this case, the stored annotation "compress" is compared with the query string "compass." It should be understood that FIG. 20 depicts the comparison of two strings as a comparison of individual letters in two differently spelled words. This depiction is intended primarily to aid in understanding the edit distance computation technique and not necessarily as a depiction of what two stroke type strings might actually look like. In this regard, each of the 64 different stroke types may be arbitrarily assigned different numerical labels. Thus the edit distance computation would compare the respective numeric labels of the stored annotation and the input query directly with each other. There is no need to convert the individual strings into ASCII characters and FIG. 20 is not intended to imply that such conversion is necessary.

Referring to FIG. 20, each time the annotation string stroke value matches the query string stroke value a cost of zero is assigned. Thus in FIG. 20, a zero cost is entered for the comparison of the first four string values "comp." To accommodate the possibility that a string/string comparison may involve insertion, deletion or substitution of values, a cost is assigned each time an insertion, deletion or substitution must be made during the comparison sequence. In the example of FIG. 20, the query string "compass" requires insertion of an additional value "r" after the value "p." A cost of one is assigned (as indicated at the entry designated 422). Continuing with the comparison, a substitution occurs between the value "e" of the stored annotation string and the value "a" of the query string. This results in an additional cost assignment of one being added to the previous cost assignment, resulting in a total cost of two, represented in FIG. 20 at 424. Aside from these insertion and substitution operations, the remainder of the comparisons match, value for value. Thus, the final "cost" in comparing the annotation string with the query string is two, represented in FIG. 20 at 426.

In the preceding discussion, a first minimum cost path was described in which "compass" is edited into "compress" by inserting an "r" and substituting an "e" for an "a." An alternative edit would be to substitute an "r" for an "a" and inserting an "e." Both of these paths have the same cost, namely two.

FIG. 21 gives another example of the edit distance computation technique. As before, strings of alphabetic characters are compared for demonstration purposes. As previously noted, this is done for convenience, to simplify the illustration, and should not be interpreted as implying that the strings must be first converted to alphanumeric text before the comparisons are made. Rather, the procedure illustrated in FIGS. 20 and 21 are performed on the respective stroke data (vector quantized symbols) of the respective stored annotation and input query strings.

FIG. 21 specifically illustrates the technique that may be used to perform an approximate match (word spotting). In FIG. 21 the stored annotation "This is compression," is compared with the query string "compass." Note how the matched region 430 is extracted from the full string of the stored annotation by scanning the last row of the table to find the indices that represent the lowest value. Note that the first (initializing) row in FIG. 21 is all 0s—this allows the approximate matching procedure to start anywhere along the database string.

The presently preferred edit distance procedure is enhanced over the conventional procedures described in the literature. In addition to the three basic editing operations (delete a character, insert a character, and substitute one character for another), it is useful to add two new operations when comparing pen stroke sequences. These new operations are "split" (substitute two strokes for one stroke) and "merge" (substitute one stroke for two strokes). These additional operations allow for errors made in stroke segmentation and generally leads to more accurate results.

The use of our enhanced edit distance procedure is illustrated in FIG. 21. In FIG. 21 the split operation is used to substitute the letters "re" in "compress" for the letter "a" in "compass." Note that the backtracking arrow in FIG. 21 spans one row but two columns, thereby signifying the multicharacter (merge) substitution. Hence the edit distance is one, not two, in this case. By way of comparison, FIG. 20 illustrates the basic edit distance algorithm without utilizing the two new multicharacter operations. Thus the cost (as depicted in FIG. 20) of editing "compass" into "compress" is two.

The above-described procedure works well in most user-drawn annotation applications. The combined use of vector quantizing and edit distance computation yield a system that is remarkably robust in its ability to find matching strings and substrings, even if they are not drawn precisely the same way by the user. Although the presently preferred embodiment has been illustrated here, a number of variations are possible without departing from the spirit of the invention. For example, if a faster match is desired, the system may perform an initial "first pass" match by simply finding all strokes that have a similar number of data points. This may be done by storing the number of data points as part of the feature data and then simply selecting or excluding those strokes that are not within a predetermined data point count. This type of first pass search can be performed quite quickly, as simple numeric matching algorithms are all that are required. The first pass technique based on data point count would not, however, allow matching substrings to be extracted as the edit distance computation permits. Where higher matching accuracy is desired a more computationally costly matching technique such as a Hidden Markov Model technique may be used as a final pass on the n-best hypotheses determined by the edit distance computation. Adding a highly accurate, but computationally costly processing stage to the final output may be used in systems where it is necessary to discriminate between a large number of highly similar strings.

The foregoing discussion discloses and describes exemplary embodiments of the present invention. One skilled in the art will readily recognize from such discussion and from the accompany drawings and claims, that various changes, modifications and variations can be made therein without departing from the spirit and scope of the invention as defined in the following claims.

What is claimed is:

1. An audio/video system having an enhanced video user environment, comprising:
   an audio/video control apparatus for selectively performing predetermined audio/video control functions in accordance with a user's selection, said control apparatus including a port for coupling to a video display apparatus for displaying video material;
   a remote control apparatus having a digitizing writing surface for entry of hand-drawn instructions by a user, said remote control apparatus communicating with said audio/video control apparatus;
   a processor communicating with at least one of said audio/video control apparatus and said remote control apparatus for controlling operation of said video display apparatus in accordance with said hand-drawn instructions wherein said processor has an associated database of stored annotations and wherein said processor compares said stored annotations with said hand-drawn instructions by peforming an edit distance analysis to account for mismatch between said stored annotations and said hand-drawn instructions.

2. The system of claim 1 wherein said remote control comprises a hand-held push-button remote control structure with said digitizing writing surface incorporated into said structure.

3. The system of claim 1 wherein said remote control communicates with said audio/video control apparatus by infrared signals.

4. The system of claim 1 wherein said remote control communicates bidirectionally with said audio/video control apparatus.

5. The system of claim 1 wherein said remote control includes a microphone for input of speech instructions.

6. The system of claim 1 wherein said digitizing writing surface is responsive to a hand-held stylus.

7. The system of claim 1 wherein said digitizing writing surface is response to the user's fingertip.

8. The system of claim 1 wherein said audio/video control apparatus includes at least one control port for coupling to at least one component of audio/video equipment and wherein said audio/video control apparatus includes a control module for issuing control signals through said control port to said component of audio/video equipment.

9. The system of claim 8 wherein said component of audio/video equipment is a component selected from the group consisting of television, video cassette recorder (VCR), audio tape recorder, audio disc player, video disc player, audio amplifier, surround sound processor, video signal processor, camcorder, video telephone, cable television signal selector, satellite antenna controller, computer, CD-ROM player, photo CD player, video game player and information network access device.

10. The system of claim 1 wherein said processor is disposed in said audio/video control apparatus.

11. The system of claim 1 wherein said processor is attached to said audio/video control apparatus.

12. The system of claim 1 wherein said processor is disposed in said remote control apparatus.

13. The system of claim 1 wherein said processor comprises a multiprocessor system having a first portion disposed in said audio/video control apparatus and having a second portion disposed in said remote control.

14. The system of claim 1 wherein said audio/video control apparatus includes an integrated television tuner for tuning a user selected channel carrying program information and providing a video signal representing said program information to said video display apparatus.

15. The system of claim 1 wherein said video display apparatus is a television and wherein said audio/video control apparatus outputs an NTSC video signal through said port.

16. The system of claim 1 wherein said audio/video control apparatus is incorporated into a component of audio/video equipment.

17. The system of claim 16 wherein said component of audio/video equipment is a component selected from the group consisting of television, video cassette recorder (VCR), audio tape recorder, audio disc player, video disc player, audio amplifier, surround sound processor, video signal processor, camcorder, video telephone, cable television signal selector, satellite antenna controller, computer, CD-ROM player, photo CD player, video game player and information network access device.

18. The system of claim 1 wherein said processor includes a speech recognizer module.

19. The system of claim 1 wherein said processor generates at least one menu of user selectable system control options and said audio/video control apparatus issues a signal through said port to display said menu on said video display apparatus coupled to said port.

20. The system of claim 1 wherein said processor is coupled to memory means for storing user input.

21. The system of claim 20 wherein said user input comprises handwritten annotations drawn on said digitizing writing surface.

22. The system of claim 21 including an on-demand video interface whereby said handwritten annotations are used to recall a prerecorded entertainment program for presentation on said video display apparatus.

23. The system of claim 21 wherein said handwritten annotations are translated into a known computer character set for subsequent processing.

24. An audio/video system having an enhanced video user environment, comprising:

an audio/video control apparatus for selectively performing predetermined audio/video control functions in accordance with a user's selection, said control apparatus including a port for coupling to a video display apparatus for displaying video material;

a remote control apparatus for communicating with said audio/video control apparatus, said remote control apparatus having a digitizing writing display surface for entry of hand-drawn instructions by a user and for displaying information to said user;

a multiprocessor system having a first portion disposed in said audio/video control apparatus and having a second portion disposed in said remote control, said multiprocessor system communicating between said audio/video control apparatus and said remote control apparatus for controlling operation of said video display apparatus in accordance with said hand-drawn instructions wherein said multiprocessor system has an associated database of stored annotations and wherein said multiprocessor system compares said stored annotations with said hand-drawn instructions by peforming an edit distance analysis to account for mismatch between said stored annotations and said hand-drawn instructions.

25. The system of claim 24 wherein at least one processor of said multiprocessor system generates at least one menu of user-selectable system control operations and said audio/video control apparatus produces a signal through said port to display said menu on said video display apparatus coupled to said port.

26. The system of claim 24 wherein said remote control comprises a hand-held push-button remote control structure with said digitizing writing surface incorporated into said structure.

27. The system of claim 24 wherein said remote control communicates with said audio/video control apparatus by infrared signals.

28. The system of claim 24 wherein said remote control communicates birdirectionally with said audio/video control apparatus.

29. The system of claim 24 wherein said remote control includes a microphone for input of speech instructions.

30. The system of claim 24 wherein said digitizing writing surface is responsive to a hand-held stylus.

31. The system of claim 24 wherein said digitizing writing surface is responsive to the user's fingertip.

* * * * *